United States Patent
Kudou et al.

(10) Patent No.: US 7,982,224 B2
(45) Date of Patent: Jul. 19, 2011

(54) SEMICONDUCTOR DEVICE WITH SILICON CARBIDE EPITAXIAL LAYER INCLUDING DOPANT PROFILES FOR REDUCING CURRENT OVERCONCENTRATION

(75) Inventors: Chiaki Kudou, Hyogo (JP); Osamu Kusumoto, Nara (JP); Koichi Hashimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 12/518,483

(22) PCT Filed: Oct. 10, 2008

(86) PCT No.: PCT/JP2008/002880
§ 371 (c)(1),
(2), (4) Date: Jun. 10, 2009

(87) PCT Pub. No.: WO2009/050871
PCT Pub. Date: Apr. 23, 2009

(65) Prior Publication Data
US 2010/0295060 A1    Nov. 25, 2010

(30) Foreign Application Priority Data
Oct. 15, 2007  (JP) .................................. 2007-267582

(51) Int. Cl.
*H01L 29/15*  (2006.01)
(52) U.S. Cl. .......... 257/77; 257/328; 257/329; 257/339; 257/341; 257/342; 257/E21.054; 257/E29.104
(58) Field of Classification Search ............... 257/77, 257/328, 329, 339, 341, 342, E21.054, E29.104
See application file for complete search history.

(56) References Cited

U.S. PATENT DOCUMENTS

| | | | | |
|---|---|---|---|---|
| 6,165,822 A | * | 12/2000 | Okuno et al. | 438/142 |
| 6,297,100 B1 | * | 10/2001 | Kumar et al. | 438/268 |
| 6,452,228 B1 | * | 9/2002 | Okuno et al. | 257/329 |
| 6,455,892 B1 | * | 9/2002 | Okuno et al. | 257/328 |
| 6,482,704 B1 | * | 11/2002 | Amano et al. | 438/285 |

(Continued)

FOREIGN PATENT DOCUMENTS

JP    10-308510    11/1998

(Continued)

OTHER PUBLICATIONS

International Search Report for corresponding Appl. No. PCT/JP2008/002880 completed Dec. 19, 2008.

*Primary Examiner* — Andy Huynh
(74) *Attorney, Agent, or Firm* — Renner, Otto, Boisselle & Sklar, LLP

(57) ABSTRACT

A semiconductor device includes: a semiconductor substrate of silicon carbide of a first conductivity type; a silicon carbide epitaxial layer of the first conductivity type, which has been grown on the principal surface of the substrate; well regions of a second conductivity type, which form parts of the silicon carbide epitaxial layer; and source regions of the first conductivity type, which form respective parts of the well regions. A channel epitaxial layer of silicon carbide is grown over the well regions and source regions of the silicon carbide epitaxial layer. A portion of the channel epitaxial layer located over the well regions functions as a channel region. A dopant of the first conductivity type is implanted into the other portions and of the channel epitaxial layer except the channel region.

8 Claims, 15 Drawing Sheets

U.S. PATENT DOCUMENTS

| | | |
|---|---|---|
| 6,573,534 B1 | 6/2003 | Kumar et al. |
| 6,690,035 B1 | 2/2004 | Yokogawa et al. |
| 2003/0020136 A1 | 1/2003 | Kitabatake et al. |
| 2005/0001217 A1 | 1/2005 | Kusumoto et al. |
| 2006/0057796 A1 | 3/2006 | Harada et al. |

FOREIGN PATENT DOCUMENTS

| | | |
|---|---|---|
| JP | 11-261061 | 9/1999 |
| JP | 11-266017 | 9/1999 |
| JP | 11-330091 | 11/1999 |
| JP | 2002-270839 | 9/2002 |
| JP | 3527496 | 2/2004 |
| JP | 2005-353877 | 12/2005 |
| JP | 3773489 | 2/2006 |
| JP | 3784393 | 3/2006 |
| JP | 2007-066959 | 3/2007 |
| JP | 2008-098536 | 4/2008 |

* cited by examiner (a)

(b)

(a)

(b)

(a)

(b)

(a)

(b)

(a)

(b)

(a)

(b)

SEMICONDUCTOR DEVICE WITH SILICON CARBIDE EPITAXIAL LAYER INCLUDING DOPANT PROFILES FOR REDUCING CURRENT OVERCONCENTRATION

TECHNICAL FIELD

The present invention relates to a semiconductor device and a method for fabricating the device. More particularly, the present invention relates to a power semiconductor device of silicon carbide, which can be used as a device with a breakdown voltage that is high enough to draw large currents.

BACKGROUND ART

A power semiconductor device is a device that has such a high breakdown voltage as to draw large amounts of current from it and that is required to cause as low loss as possible. In the past, such power semiconductor devices used to be fabricated on a silicon (Si) substrate in most cases. Recently, however, power semiconductor devices with a silicon carbide (SiC) substrate have attracted a lot of attention and have been researched and developed extensively (see Patent Documents Nos. 1 to 6, for example).

As a semiconductor material, silicon carbide (SiC) has a dielectric breakdown strength that is one-digit higher than that of silicon (Si). That is why even if the thickness of a depletion layer is reduced at a pn junction or a Schottky junction, the SiC substrate can still maintain a sufficiently high avalanche breakdown voltage. For that reason, by using SiC, the device can not only have its overall thickness reduced but also be doped at a higher level as well. With these advantageous features, SiC is expected to be a promising material to make a power semiconductor device that has a low ON-state resistance and a high breakdown voltage and that would cause just low loss.

Patent Document No. 1 discloses a silicon carbide semiconductor device that can have increased ON-state resistance by increasing its channel mobility. FIG. 17 illustrates a silicon carbide semiconductor device of the type disclosed in Patent Document No. 1.

The silicon carbide semiconductor device 1000 shown in FIG. 17 is an n-channel planar-gate MOSFET (vertical power MOSFET) and includes an n$^+$-SiC substrate 101. On the principal surface of the n$^+$-SiC substrate 101, an n$^-$-SiC epitaxial layer (which will be sometimes simply referred to herein as an "epi-layer") 102 has been grown. And in predetermined regions at the surface of the n$^-$-SiC epi-layer 102, a p-SiC base layer has been formed as well regions 103$a$ and 103$b$ to reach a predetermined depth. In the base layer 103$a$ and 103$b$, n$^+$-source regions 104$a$ and 104$b$ have been defined. And another thin epi-layer has been formed over the n$^-$-SiC epi-layer 102 so as to contact with the n$^+$-source regions 104$a$ and 104$b$. Portions of that thin epi-layer (i.e., n$^+$-regions 106$a$ and 106$b$) form integral parts of the source regions 104$a$ and 104$b$ that are located right under them. Meanwhile, another portion of that thin epi-layer interposed between the source regions 104$a$ and 104$b$ has n$^-$-type. And parts of the n$^-$-region of that channel epi-layer 105 that are in contact with the p-base regions 103$a$ and 103$b$ function as channel regions 140.

Over the channel epi-layer 105, arranged is a gate electrode 108 with a gate oxide 107 sandwiched between them. The gate electrode 108 is covered with an insulating layer 109, on which a source electrode 110 is arranged so as to make electrical contact with the base regions 103$a$ and 103$b$ and the source regions 104$a$ and 104$b$. And on the back surface of the SiC substrate 101, a drain electrode 111 has been formed.

In the semiconductor device 1000 shown in FIG. 17, when a voltage is applied to the gate electrode 108, a stored channel is induced in the channel epi-layer 105, thereby making carriers (charge) flow between the source electrode 110 and the drain electrode 111.

By operating a MOSFET in a storage mode in which a channel is induced without inverting the conductivity type of the channel forming layer in this manner, the channel mobility can be increased and the ON-state resistance can be reduced compared to a MOSFET of an inversion mode in which a channel is induced by inverting the conductivity type.

Patent Document No. 1: Japanese Patent Application Laid-Open Publication No. 10-308510
Patent Document No. 2: Japanese Patent Publication No. 3773489
Patent Document No. 3: Japanese Patent Publication No. 3784393
Patent Document No. 4: Japanese Patent Publication No. 3527496
Patent Document No. 5: Japanese Patent Application Laid-Open Publication No. 11-266017
Patent Document No. 6: Japanese Patent Application Laid-Open Publication No. 2008-098536

DISCLOSURE OF INVENTION

Problems to be Solved by the Invention

The semiconductor device 1000 described above uses such a structure with the channel epi-layer 105, thereby reducing the ON-state resistance with the channel mobility increased. However, the present inventors discovered and confirmed via experiments that in such a structure, too much current might get concentrated locally in just a portion of the channel epi-layer 105, thus possibly making the reduction of the ON-state resistance less effective.

In order to overcome the problems described above, the present invention has an object of providing a semiconductor device that can minimize such an increase in ON-state resistance due to such an overconcentration of the currents.

Means for Solving the Problems

A semiconductor device according to the present invention includes: a semiconductor substrate of silicon carbide of a first conductivity type, which has a principal surface and a back surface that is opposite to the principal surface; a silicon carbide epitaxial layer of the first conductivity type, which has been grown on the principal surface of the semiconductor substrate and which has a lower dopant concentration than the semiconductor substrate; well regions of a second conductivity type, which form parts of the silicon carbide epitaxial layer; source regions of the first conductivity type, which form respective parts of the well regions; and a channel epitaxial layer of silicon carbide of the first conductivity type, which has been grown on the silicon carbide epitaxial layer. The channel epitaxial layer includes: a first portion, which is located over the source regions; a second portion, which is located over another part of the silicon carbide epitaxial layer where the well regions are not defined; and a channel region, which is located over the well regions and which is interposed between the first and second portions. The dopant concentration of the first and second portions is lower than that of the source regions but higher than that of the channel region.

In one preferred embodiment, in the channel epitaxial layer, the first and second portions thereof have the same dopant concentration.

In another preferred embodiment, an edge of the first portion that is adjacent to the channel region has been offset so as to be located more distant from the second portion than the boundary between the source and well regions is, and an edge of the second portion has been offset so as to be located more distant from the first portion than the boundary between the silicon carbide epitaxial layer of the first conductivity type and the well regions is.

In still another preferred embodiment, the semiconductor device further includes: a gate oxide film, which has been formed on the channel epitaxial layer; a gate electrode, which has been formed on the gate oxide film; source electrodes, which have been formed on the source regions; and a drain electrode, which has been formed on the back surface of the semiconductor substrate.

In yet another preferred embodiment, the gate oxide film is thicker over the first and second portions of the channel epitaxial layer than over the channel region.

In yet another preferred embodiment, a part of the silicon carbide epitaxial layer that is interposed between the well regions functions as a JFET region.

In this particular preferred embodiment, a dopant of the first conductivity type has been implanted into the JFET region.

In a specific preferred embodiment, the concentration of the dopant of the first conductivity type that has been implanted into the JFET region is lower than that of the dopant of the second conductivity type in the well regions.

A method for fabricating a semiconductor device according to the present invention includes the steps of: (a) growing a silicon carbide epitaxial layer of a first conductivity type on the principal surface of a semiconductor substrate of silicon carbide of the first conductivity type so that the silicon carbide epitaxial layer has a lower dopant concentration than the semiconductor substrate; (b) defining well regions of a second conductivity type so that the well regions form parts of the silicon carbide epitaxial layer; (c) defining a source region of the first conductivity type in each of the well regions; (d) growing a channel epitaxial layer of silicon carbide on the silicon carbide epitaxial layer; and (e) implanting a dopant of the first conductivity type into not only a first portion of the channel epitaxial layer, which is located over the source regions, but also a second portion of the channel epitaxial layer, which is located at the surface of another part of the silicon carbide epitaxial layer of the first conductivity type where the well regions have not been defined.

In one preferred embodiment, the step (e) includes the steps of: (e1) masking the surface of the channel epitaxial layer on its parts of the second conductivity type, which are located between the surface of that part of the silicon carbide epitaxial of the first conductivity type and the surface of the source regions; and (e2) implanting the dopant of the first conductivity type into non-masked portions of the channel epitaxial layer.

In this particular preferred embodiment, the step (b) includes the steps of: (b1) making a well mask to define the well regions; and (b2) implanting the dopant of the second conductivity type into portions of the silicon carbide epitaxial layer that are not covered with the well mask. The step (c) includes the steps of: (c1) making a source mask to define the source regions; and (c2) implanting the dopant of the first conductivity type into portions of the silicon carbide epitaxial layer that are not covered with the source mask. The step (c1) includes forming a sidewall on a side surface of the well mask.

In another preferred embodiment, the method further includes the step (f) of etching away portions of the channel epitaxial layer so that the source regions are exposed at least partially after the step (e) has been performed.

In still another preferred embodiment, the method further includes the steps of: (g) forming a gate oxide film on the channel epitaxial layer; (h) forming a gate electrode on the gate oxide film; (i) forming source electrodes on the source regions; and (j) forming a drain electrode on the back surface of the semiconductor substrate.

In this particular preferred embodiment, the step (e) includes implanting phosphorus as the dopant of the first conductivity type. The method includes the step of forming the gate oxide film by oxidizing the surface of the channel epitaxial layer after the step (e) has been performed.

In yet another preferred embodiment, the method further includes the step of implanting the dopant of the first conductivity type into a surface region of the silicon carbide epitaxial layer that is interposed between the two adjacent well regions either after or during the step (e).

In a specific preferred embodiment, the concentration of the dopant of the first conductivity type that has been implanted into the surface region of the silicon carbide epitaxial layer that is interposed between the two adjacent well regions is lower than that of the dopant of the second conductivity type in the well regions.

Effects of the Invention

According to the present invention, a dopant of a first conductivity type is implanted into the entire channel epitaxial layer except the channel region thereof, and therefore, it is possible to reduce the overconcentration of currents in the source region near its interface with the well region and/or in the silicon carbide epitaxial layer near its interface with the well region. As a result, an increase in ON-state resistance that would be caused by such an overconcentration of currents can be minimized.

Also, according to a preferred embodiment of the present invention, after source regions have been defined in a self-aligned manner (i.e., so that the source regions determine their own locations by themselves) with respect to the well regions, a channel epitaxial layer is formed. That is why the regions into which the dopant of the first conductivity type needs to be implanted can be defined independently of the locations of the source regions.

Figure 1:
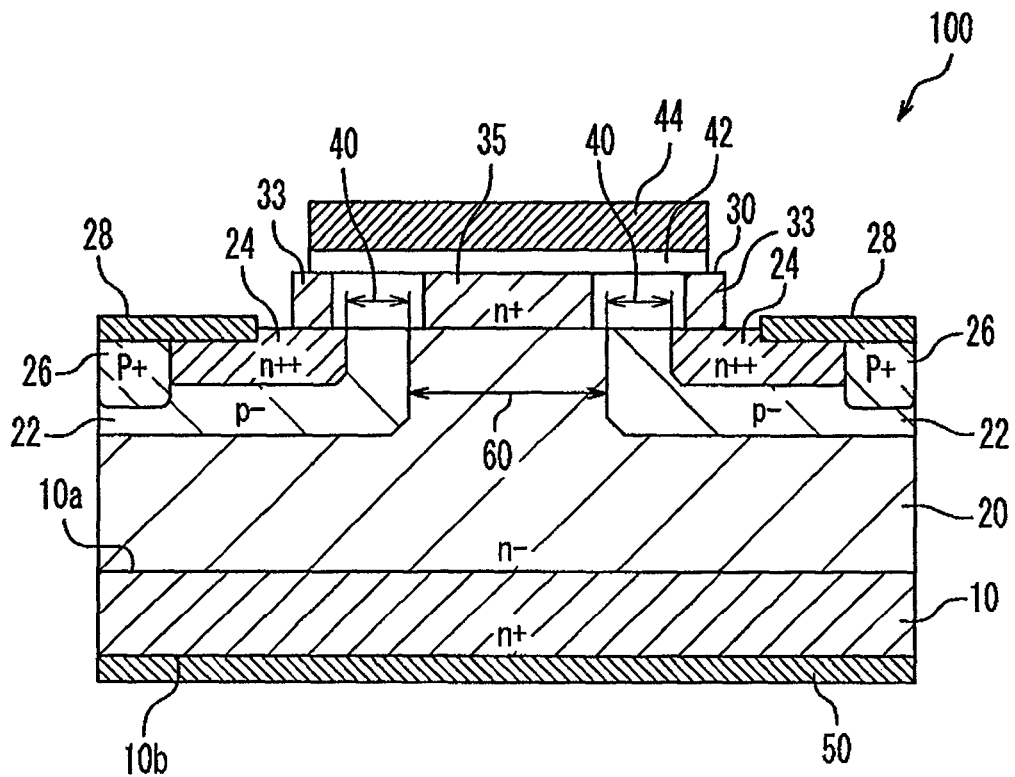
FIG. 1 is a cross-sectional view schematically illustrating the structure of a semiconductor device as a first preferred embodiment of the present invention.

DESCRIPTION OF REFERENCE NUMERALS 10 semiconductor substrate
20 drift epi-layer (silicon carbide epitaxial layer)
22 well region
24 source region
28 source electrode
30 channel epi-layer (channel epitaxial layer)
40 channel region
42 gate oxide film
44 gate electrode
50 drain electrode
60 JFET region
90 C cap film
100 semiconductor device
200 conventional silicon carbide semiconductor device
1000 semiconductor device (silicon carbide semiconductor device)

BEST MODE FOR CARRYING OUT THE INVENTION

Hereinafter, preferred embodiments of the present invention will be described with reference to the accompanying drawings. In the drawings, any pair of members shown in multiple drawings and having substantially the same function is identified by the same reference numeral for the sake of simplicity of description. It should be noted that the present invention is in no way limited to the specific preferred embodiments to be described below.

Embodiment 1

FIG. 1 schematically illustrates the cross-sectional structure of a semiconductor device 100 as a first specific preferred embodiment of the present invention. As Shown in FIG. 1, the semiconductor device 100 of this preferred embodiment includes: a semiconductor substrate 10 of silicon carbide (SiC) of a first conductivity type (which will be referred to herein as an "SiC substrate"); a silicon carbide epitaxial layer 20 of the first conductivity type, which has a lower dopant concentration than the semiconductor substrate 10; well regions 22 of a second conductivity type, which form parts of the silicon carbide epitaxial layer 20; and source regions 24 of the first conductivity type, which form respective parts of the well regions 22. The semiconductor substrate (SiC substrate) 10 has a principal surface 10a and a back surface 10b that is opposite to the principal surface 10a. And the silicon carbide epitaxial layer 20 has been grown on that principal surface 10a of the semiconductor substrate 10.

A channel epitaxial layer 30 of silicon carbide has been formed on the silicon carbide epitaxial layer 20. In the following description, the "epitaxial layer" will sometimes be simply referred to herein as an "epi-layer". That is why the silicon carbide epitaxial layer 20 will be referred to herein as a "drift epi-layer 20" and the channel epitaxial layer 30 as a "channel epi-layer 30" in some cases.

In the channel epi-layer 30, an n-type dopant has been implanted into a first portion 33 thereof that is located over the source regions 24. The n-type dopant has also been implanted into a second portion 35 of the channel epi-layer 30, which is located over a surface region of the silicon carbide epitaxial layer 20 where no well regions 22 are defined (and which will be referred to herein as an "n-type surface"). The dopant concentration in the first and second portions 33 and 35 are defined to be lower than that of the source regions 22.

On the other hand, the n-type dopant concentration in the rest of the channel epi-layer 30 that is located over the well regions 22 and interposed between the first and second portions 33 and 35 is lower than the dopant concentration of the first and second portions 33 and 35. And that portion includes a channel region 40.

The channel region 40 is a portion of the channel epi-layer 30 that is located right on the p-type surface of the well regions 22 of p⁻-type. In the example illustrated in FIG. 1, the horizontal size of the channel region 40 as indicated by the double-headed arrow is defined to be shorter than the gap between the first and second portions 33 and 35 for the reasons to be described later.

The region of the drift epi-layer 20 interposed between the two adjacent well regions 22 functions as a JFET (junction field effect transistor) region 60.

In this preferred embodiment, the first conductivity type is n-type and the second conductivity type is p-type. The semiconductor substrate 10 is an n-type SiC substrate ($n^+$-SiC substrate). The drift epi-layer 20 is an $n^-$-SiC layer. The well regions 22 are $p^-$ layer. And the source regions 24 are $n^{++}$-layer.

It should be noted that "+", "++", "−" and so on are signs representing the relative concentrations of an n- or p-type dopant. That is to say, the concentration of an n-type dopant increases in the order of "n", "$n^+$" and "$n^{++}$", and "$n^-$" represents a lower n-type dopant concentration than "n". That is why the $n^-$-drift epi-layer 20 has a lower n-type dopant concentration than the n$^+$-type SiC substrate 10. And the n$^{++}$-source regions 24 have a higher n-type dopant concentration than the n$^+$-SiC substrate 10.

In the configuration of this preferred embodiment, the n-type dopant is implanted into both the first portion 33 of the channel epi-layer 30 that is located over the source regions 24 and the second portion 35 thereof that is located over the JFET region 60, thereby defining n$^+$ regions (as the first and second portions 33 and 35) in the channel epi-layer 30. As described above, the n-type dopant concentration in these n$^+$ regions (that are the first and second portions 33 and 35) is lower than that of the source regions 24. Since the first and second portions 33 and 35 are defined by performing a selective ion implantation process with the channel region 40 of the channel epi-layer 30 masked as will be described later, the first and second portions 33 and 35 typically have the same n-type dopant concentration.

The n-type dopant concentration in the first and second portions 33 and 35 of the channel epi-layer 30 is defined to be lower than that of the source regions 24 because if the n-type dopant concentration in the first and second portions 33 and 35 were too high, the voltage to be applied to the gate insulating film would increase too much to maintain the reliability of the gate insulating film. Specifically, the n-type dopant concentration in the first and second portions 33 and 35 preferably falls within the range of $5 \times 10^{15}$ cm$^{-3}$ to $5 \times 10^{19}$ cm$^{-3}$, more preferably within the range of $5 \times 10^{15}$ cm$^{-3}$ to $5 \times 10^{18}$ cm$^{-3}$.

Between the n-type surface of the drift epi-layer 20 (i.e., the surface of the JFET region 60) and that of the source regions 24, there is the surface of the p$^-$-well regions (i.e., the p-type surface). As described above, the channel region 40 included in the channel epi-layer 30 is located right on that p-type surface.

Thus, in the channel epi-layer 30 of this preferred embodiment, there is a gap between the first portion 33 and the channel region 40, and the dopant concentration in that gap is almost as high as that of the channel region 40. Likewise, there is also a gap between the second portion 35 and the channel region 40, and the dopant concentration in that gap is almost as high as that of the channel region 40.

Such gaps are left as margins to cope with variations that would occur during the manufacturing process, and will be described in further detail later. Also, in the configuration of this preferred embodiment, the respective upper surfaces of the drift epi-layer 20, the well regions 22 and the source regions 24 are supposed to be level with each other.

Portions of the channel epi-layer 30 of this preferred embodiment, into which no n-type dopant has been introduced, are intrinsic semiconductor regions, and therefore, will sometimes be referred to herein as either an "i-layer" or a "channel epi i-layer". Optionally, the channel epi-layer 30 may also be lightly doped n$^-$-layer. Still alternatively, the channel epi-layer 30 may also have its concentration varied in the depth direction.

A gate oxide film 42 has been formed on the channel epi-layer 30, and a gate electrode 44 has been formed on the gate oxide film 42. Also, source electrodes 28 have been formed on the source regions 24. In the configuration of this preferred embodiment, the source electrodes 28 are connected to the well regions (p$^-$-layer) 22 by way of a P$^+$-layer 26. Meanwhile, a drain electrode 50 has been formed on the back surface 10b of the SiC substrate 10.

The semiconductor device 100 of this preferred embodiment is a power semiconductor device of SiC and can be used effectively as a device with a breakdown voltage that is high enough to draw large currents. Specifically, the configuration of this preferred embodiment may be obtained under the following conditions.

The n$^+$-SiC substrate 10 is made of hexagonal silicon carbide crystals and may have a thickness of 250 μm to 350 μm and a concentration of $8 \times 10^{18}$ cm$^{-3}$, for example. Meanwhile, if an n$^-$-SiC substrate 10 is used, the substrate may also be made of cubic silicon carbide crystals.

The drift epi-layer 20 is an SiC layer that has been grown epitaxially on the principal surface 10a of the SiC substrate 10 and may have a thickness of 4 μm to 15 μm and a concentration of $5 \times 10^{15}$ cm$^{-3}$, for example. Optionally, another SiC epi-layer (such as an SiC epi-layer with a concentration of $6 \times 10^{16}$ cm$^{-3}$) may be provided between the n$^+$-SiC substrate 10 and the drift epi-layer 20.

The well regions 22 may have a thickness (i.e., a pn junction depth as measured from the upper surface of the drift epi-layer 20) of 0.5 μm to 1.0 μm and a p-type dopant concentration of $1.5 \times 10^{18}$ cm$^{-3}$, for example. On the other hand, the source regions 24 may have a thickness (i.e., a pn junction depth as measured from the upper surface of the drift epi-layer 20) of 0.25 μm and an n-type dopant concentration of $5 \times 10^{19}$ cm$^{-3}$, for example. The P$^+$-layer 26 may have a thickness of 0.3 μm and a p-type dopant concentration of $2 \times 10^{20}$ cm$^{-3}$, for example. The JFET region 60 defined as the region between the two adjacent well regions 22 may have a lateral size (or width) of 3 μm, for example.

The channel epi-layer 30 is an SiC layer that has been grown epitaxially on the drift epi-layer 20, and may have a thickness of 30 nm to 150 nm, for example. The channel region 40 may have a channel length (i.e., the size indicated by the double-headed arrow 40 in FIG. 1) of 0.5 μm, for example. The location and size of the channel region 40 are defined by the relative positions of the well regions 22 and the source regions 24.

The gate oxide film 42 is made of SiO$_2$ (silicon dioxide) and may have a thickness of 70 nm, for example. The gate electrode 44 is made poly-Si (polysilicon) and may have a thickness of 500 nm, for example. The source electrodes 28 are made of an alloy of Ti (titanium) and Si (silicon) and may have a thickness of 50 nm, for example. The drain electrode 50 is also made of an alloy of Ti (titanium) and Si (silicon) and may have a thickness of 100 nm, for example. To get this SiC chip soldered with a package easily during the mounting process, the drain electrode 50 is preferably made of a stack of Ni and Ag or Ni and Au films.

In the configuration of the semiconductor device 100 of this preferred embodiment, the channel epi-layer 30 has been formed on the drift epi-layer 20 and an n-type dopant has been implanted into the entire channel epi-layer 30 except its channel region 40. Thus, it is possible to reduce the overconcentration of currents in the source regions 24 near their interface with the well regions 22 and/or in the drift epi-layer 20 near its interface with the well region 22. As a result, an increase in ON-state resistance, and eventually the deterioration of the overall performance of the device, which would be caused by such an overconcentration of currents, can be minimized.

Hereinafter, it will be described in further detail how effectively the configuration of this preferred embodiment works compared to a conventional one.

Figure 2:
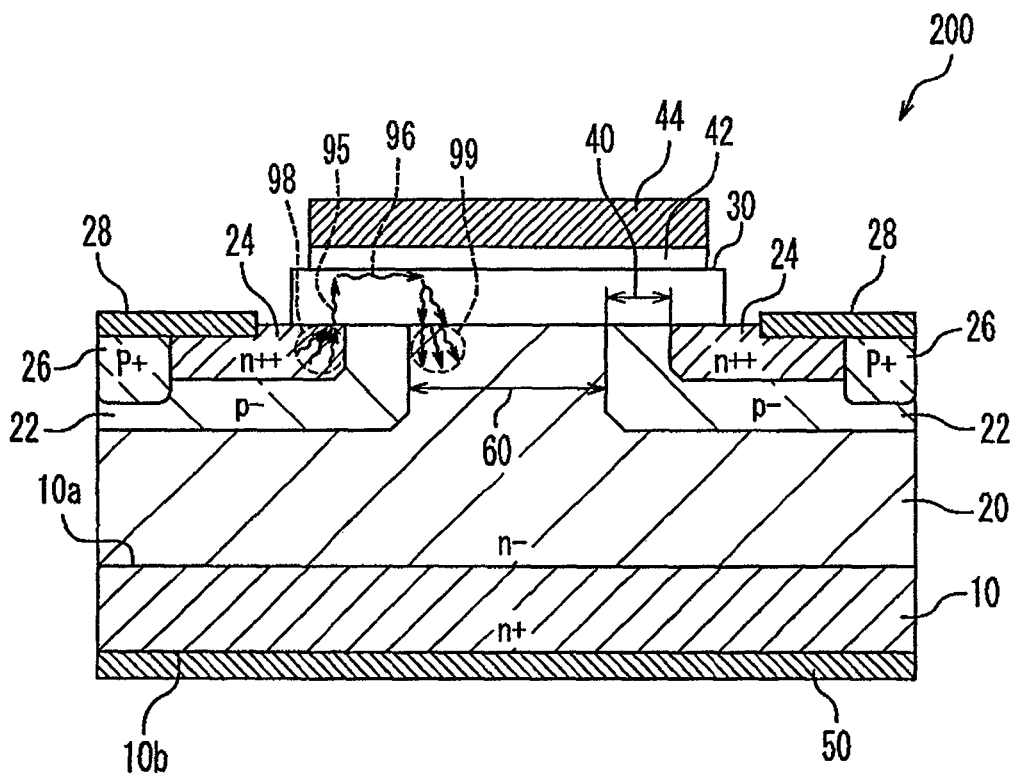
FIG. 2 is a cross-sectional view illustrating the structure of a comparative example.

FIG. 2 is a cross-sectional view illustrating a comparative example 200 for the device 100 of this preferred embodiment. In the comparative example 200 shown in FIG. 2, the channel epi-layer 30 thereof consists entirely of a lightly doped n$^-$-layer, which is quite different from the device 100 of this preferred embodiment in which the channel epi-layer 30 includes the n$^+$ portions 33 and 35.

The present inventors discovered and confirmed via experiments that the following phenomenon could occur in the configuration of the comparative example 200.

First of all, it will be described how the vertical MOSFET works. Suppose a voltage of 0 V is applied to the source electrodes 28 and a voltage of several hundreds V to several kV is applied to the drain electrode 50 by way of external resistance (not shown). In the OFF state in which a voltage that is equal to or lower than a threshold value Vth (e.g., 0 V) is applied to the gate electrode 44, a depletion layer expands from the pn junction between the well regions 22 and the drift epi-layer 20. Since the drift epi-layer 20 has a low dopant concentration, a thick depletion layer will be produced while a reverse bias voltage is applied to the pn junction. As a result, two depletion layers extending from the well regions 22 on the right- and left-hand sides meet each other in the JFET region 60.

Next, when a voltage (of 20 V, for example) that is higher than the threshold value Vth is applied to the gate electrode 44, an electric field will be applied to the channel region 40 of the channel epi-layer 30 through the gate insulating film 42. As a result, a channel of electric charge is formed in the channel epi-layer 30 and electrons flow into the channel of electric charge. In this case, the electrons that have been stored in the depletion layers in the JFET region between the well regions 22 and the drift epi-layer 20 are also used, and therefore, the potential at the well regions 22 gets closer to the source potential and the depletion layers shrink. Consequently, a current path leading to the drain electrode 50 is formed in the JFET region 60 to turn this device ON. In this case, the magnitude of the external resistance is determined so that the drain voltage becomes approximately 1 V to 2 V due to a voltage drop of the external resistance.

In this comparative example 200, the current flowing through the channel region 40 of the channel epi-layer 30 tends to go along the interface between the channel epi-layer 30 and the gate oxide film 42 as indicated by the arrow 96 under the influence of the gate electrode 44. In that case, a current 95 that flows perpendicularly through the channel epi-layer 30 is also produced and the vertical resistance produced by that current is also added, thus increasing the ON-state resistance in the end. To realize a normally OFF state by setting the threshold value Vth of the MOS transistor portion to be higher than 0 V, the channel epi-layer 30 should have a decreased concentration. In that case, the resistance will also rise along the path of the current 95.

On top of that, such a current in the channel epi-layer 30 could cause overconcentration of currents in the source regions 24 near their interface with the well regions 22 (in the encircled region 98) and in the drift epi-layer 20 near its interface with the well regions 22 (in the encircled region 99). Such overconcentration of currents will raise the resistance, thus increasing the ON-state resistance and eventually deteriorating the overall performance of the device.

More specifically, current tries to flow through a region with as low resistance as possible, and therefore, will flow through the source regions ($n^{++}$ layer) 24 as much as possible and then head vertically upward. As a result, too much current is concentrated in the region 98. Likewise, more and more current flowing toward the JFET region 60 tends to get concentrated in the region 99. As a result of these phenomena, the ON-state resistance rises and the overall performance deteriorates.

Figure 3:
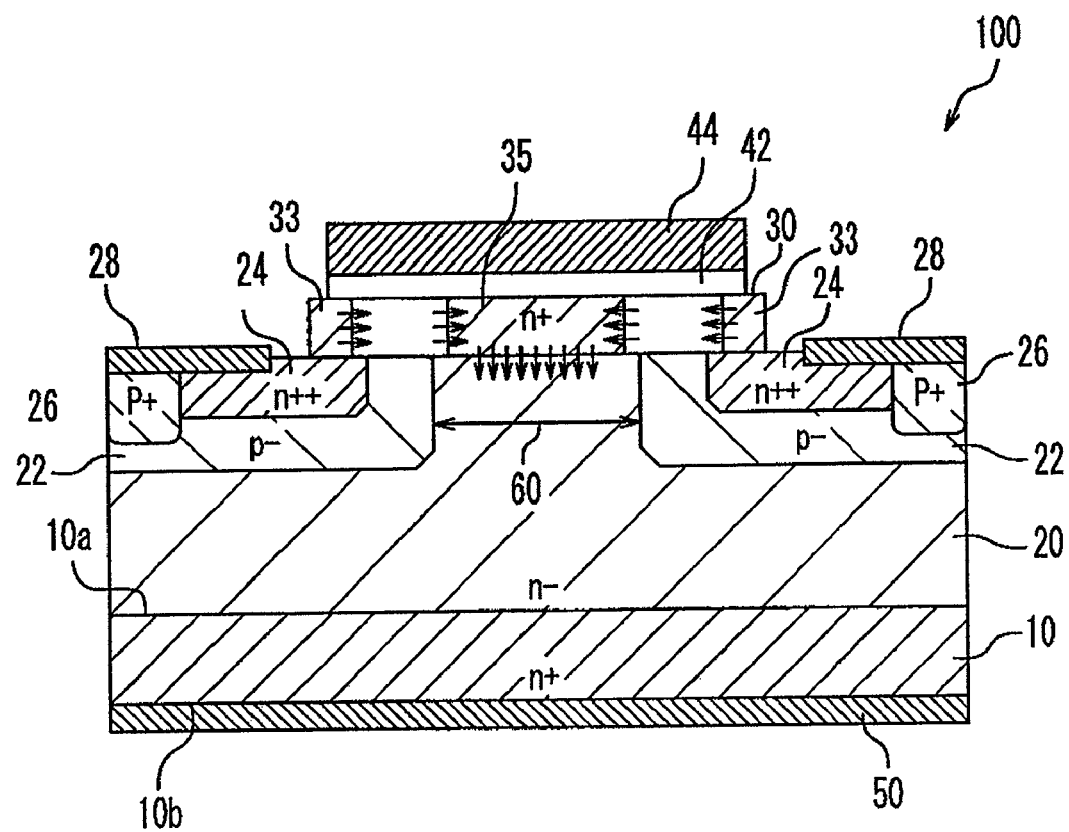
FIG. 3 is a cross-sectional view illustrating how the semiconductor device of the first preferred embodiment of the present invention operates.
Figure 4:
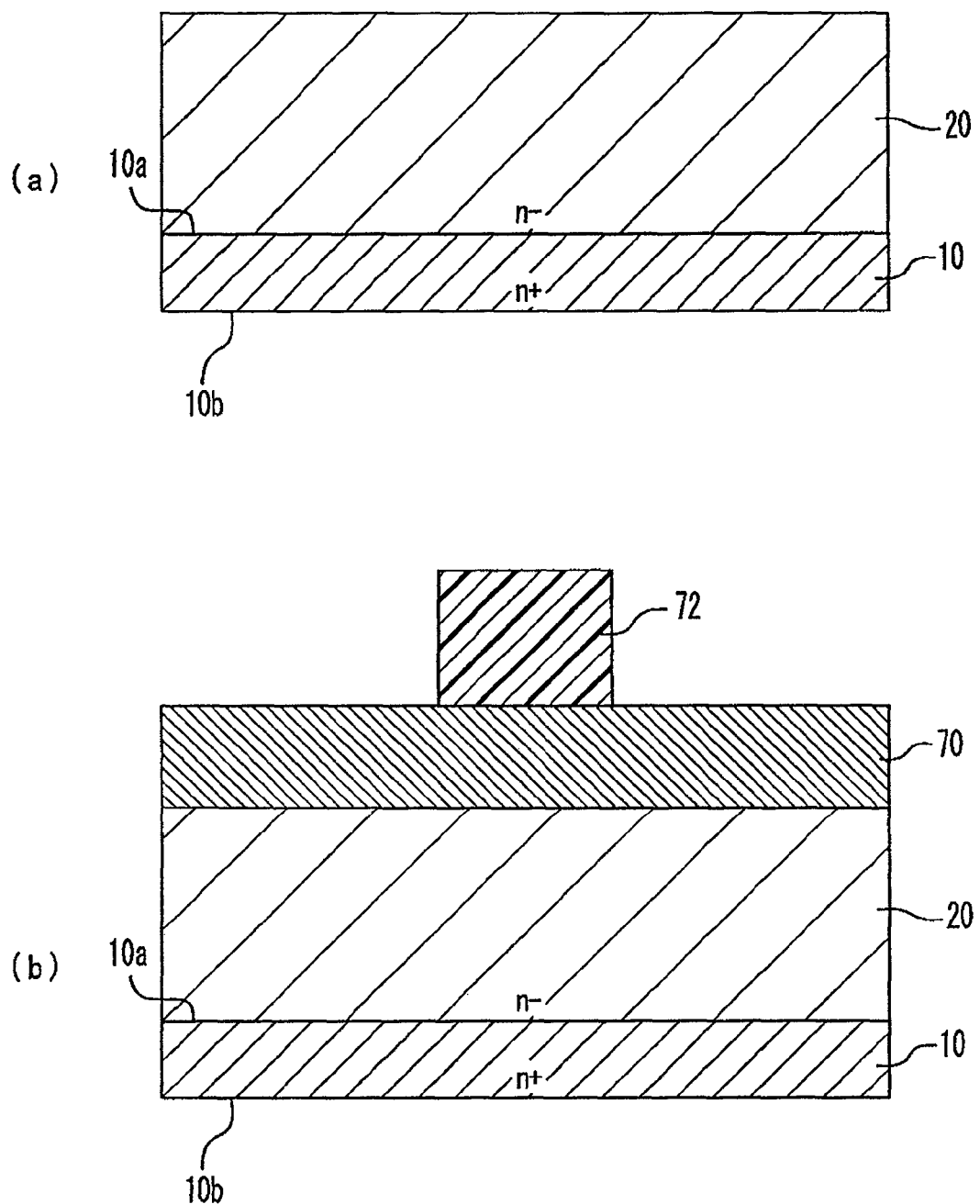
FIGS. 4(a) and 4(b) illustrate respective manufacturing process steps to fabricate the semiconductor device of the first preferred embodiment of the present invention.
Figure 5:
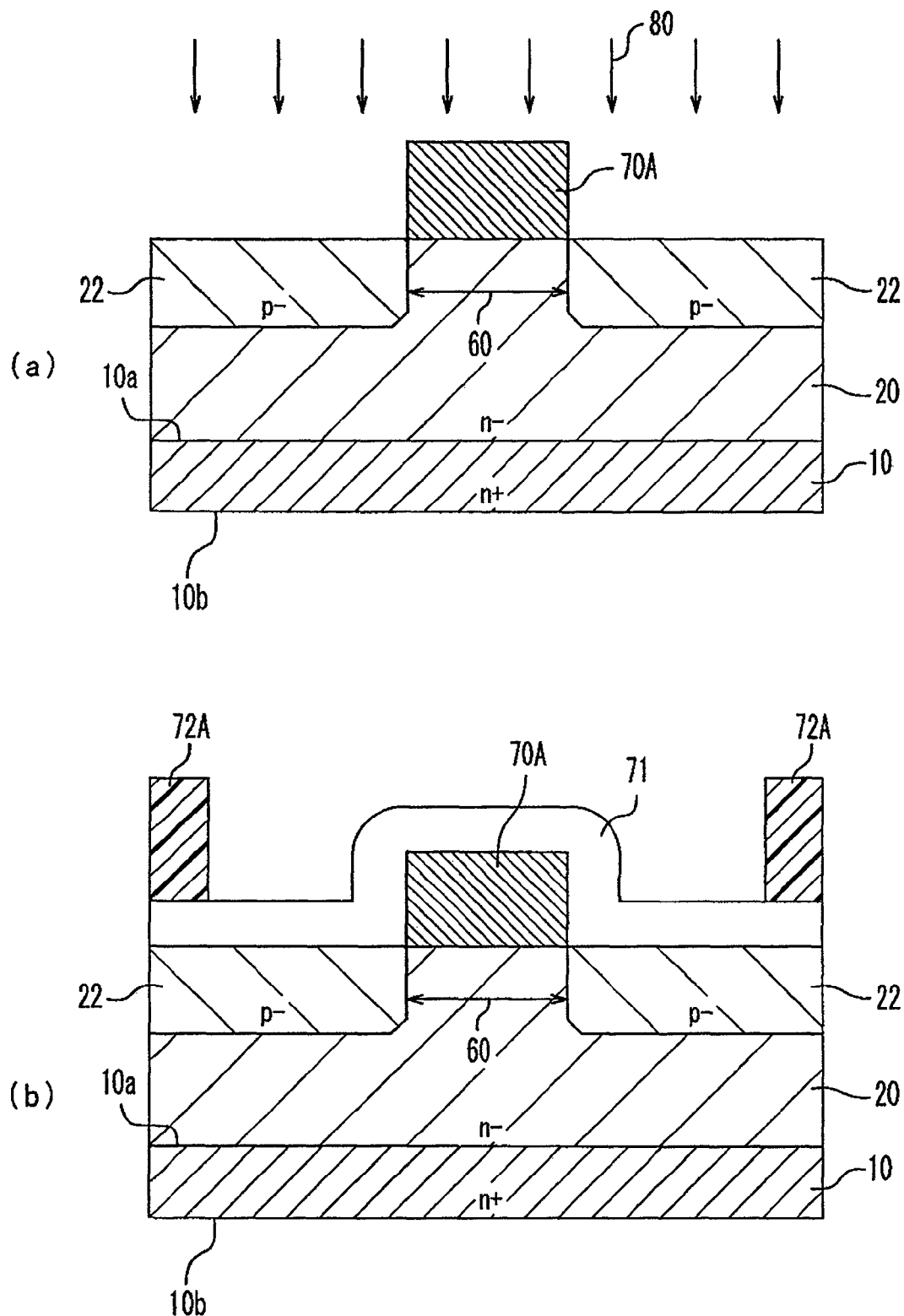
FIGS. 5(a) and 5(b) illustrate respective manufacturing process steps to fabricate the semiconductor device of the first preferred embodiment of the present invention.
Figure 6:
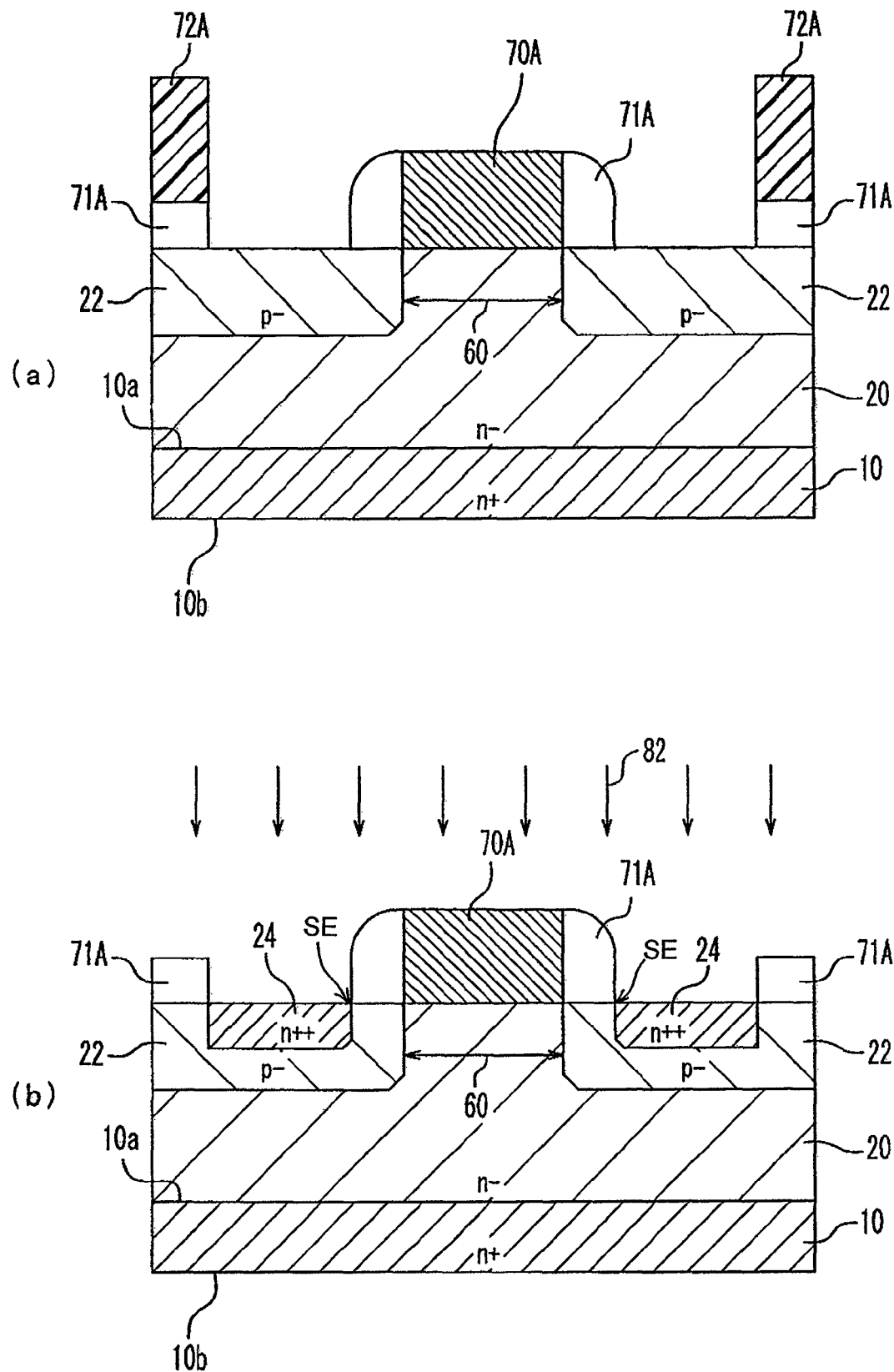
FIGS. 6(a) and 6(b) illustrate respective manufacturing process steps to fabricate the semiconductor device of the first preferred embodiment of the present invention.
Figure 7:
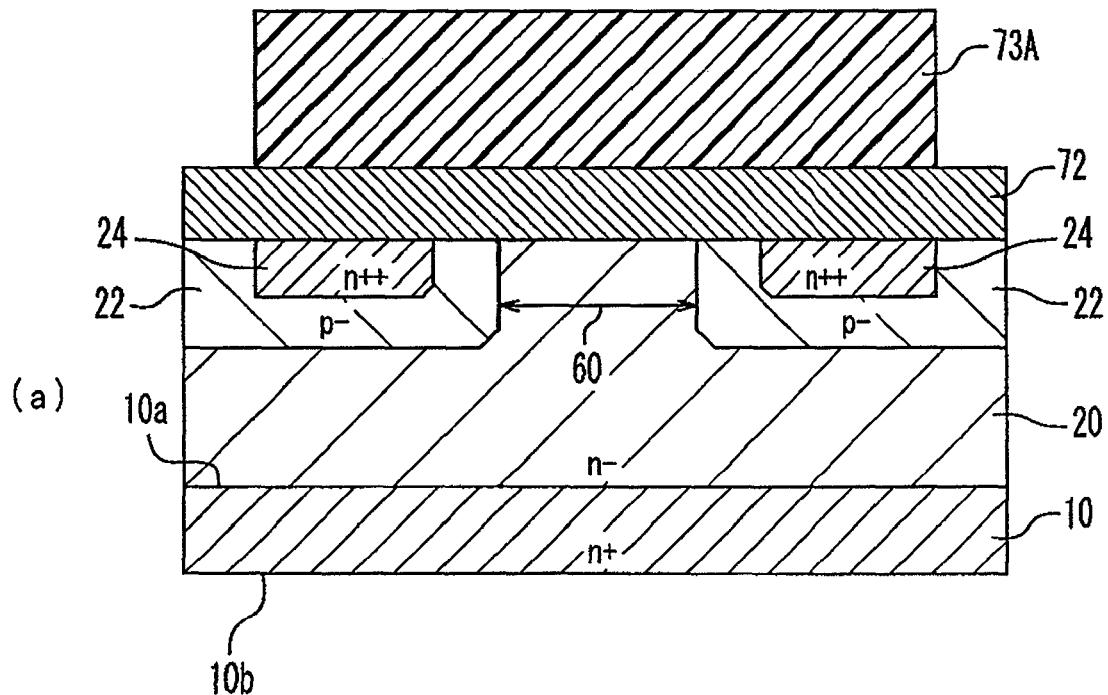
FIGS. 7(a) and 7(b) illustrate respective manufacturing process steps to fabricate the semiconductor device of the first preferred embodiment of the present invention.
Figure 7:
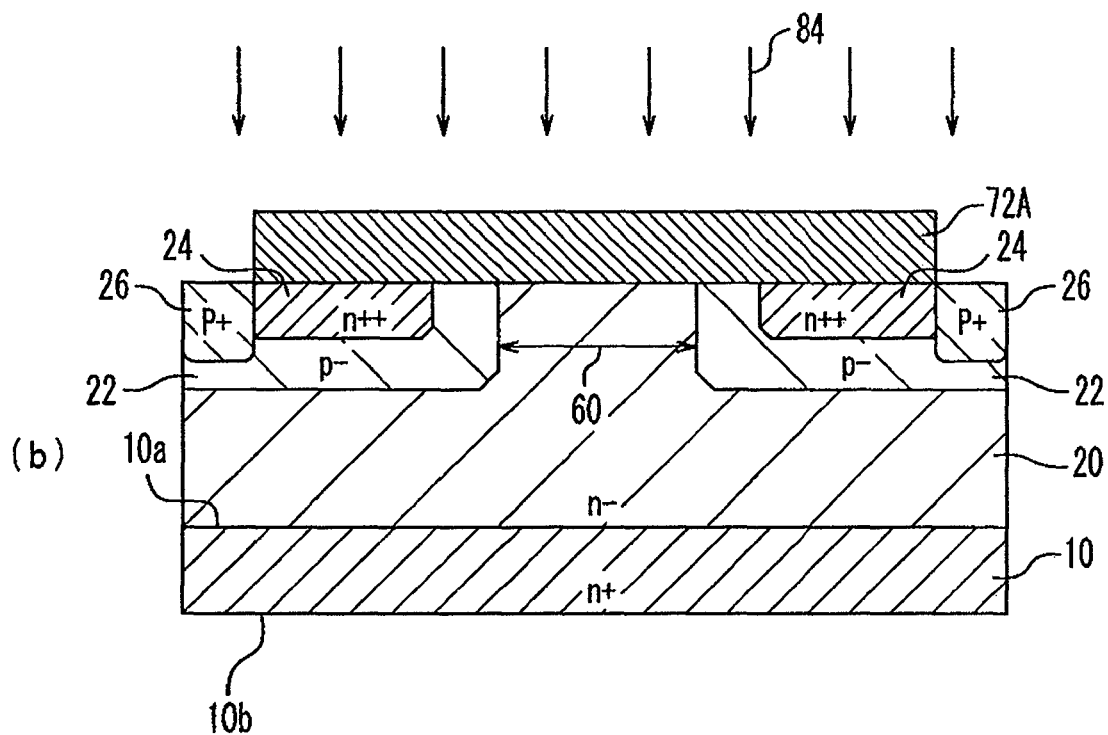
Figure 8:
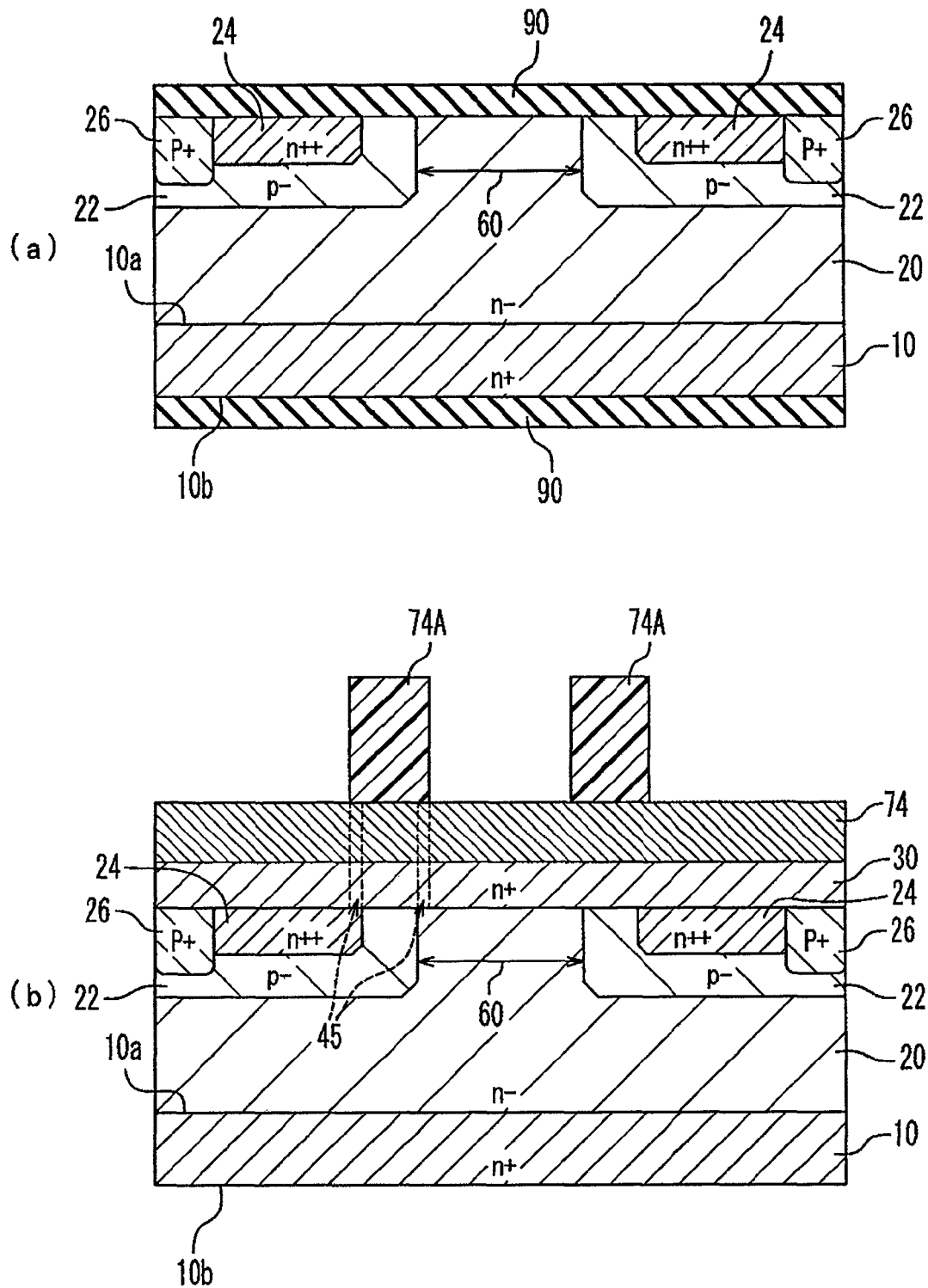
FIGS. 8(a) and 8(b) illustrate respective manufacturing process steps to fabricate the semiconductor device of the first preferred embodiment of the present invention.
Figure 9:
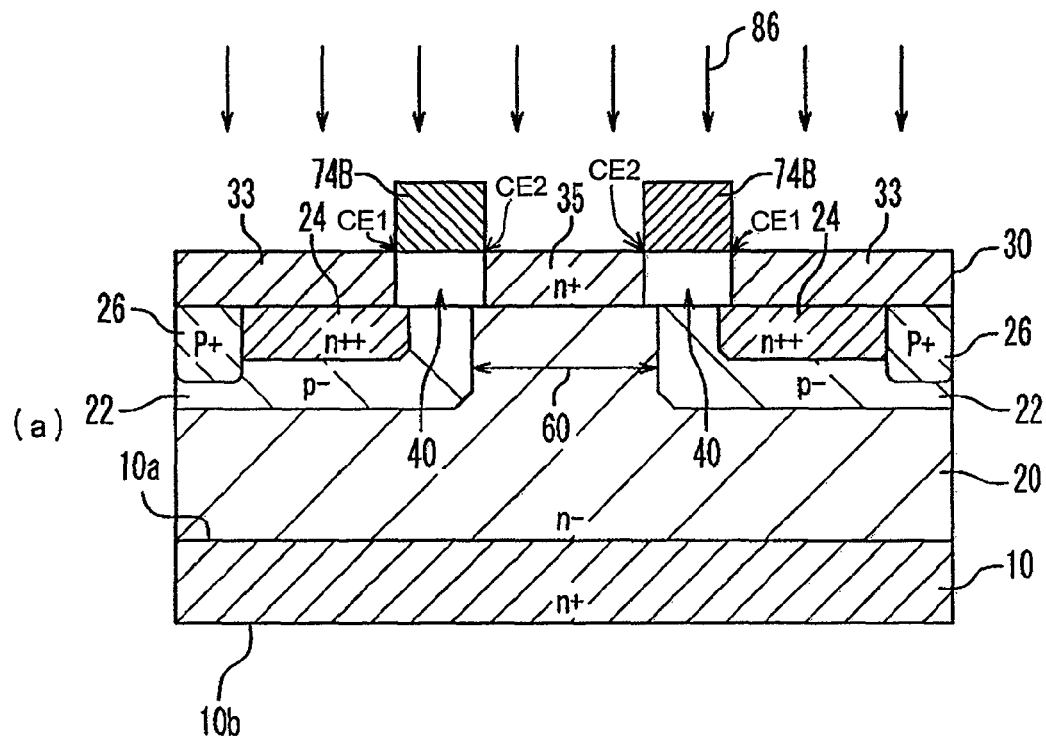
FIGS. 9(a) and 9(b) illustrate respective manufacturing process steps to fabricate the semiconductor device of the first preferred embodiment of the present invention.
Figure 9:
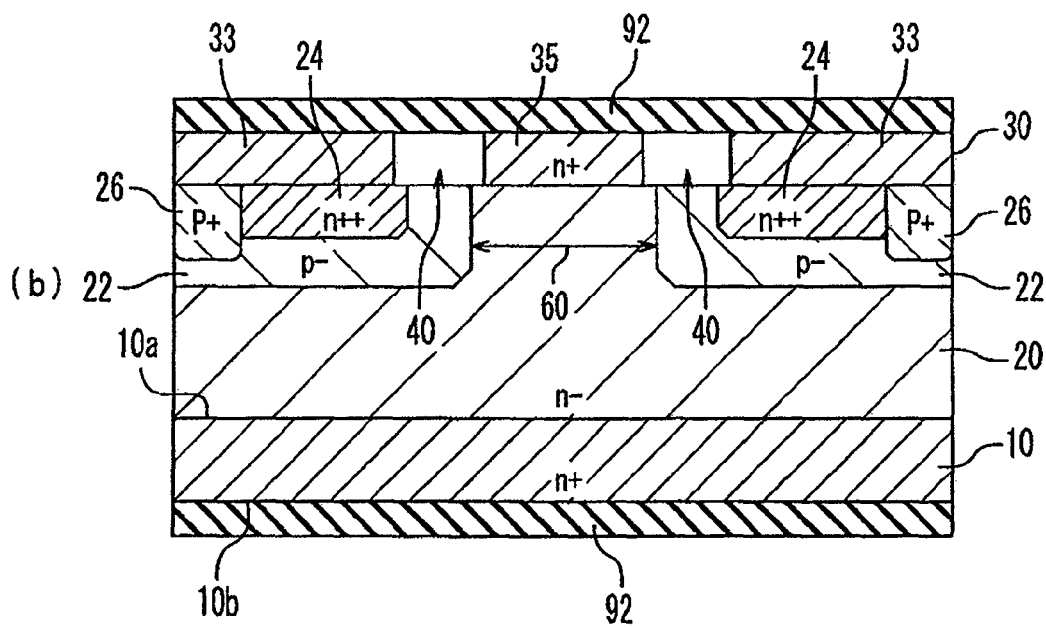
Figure 10:
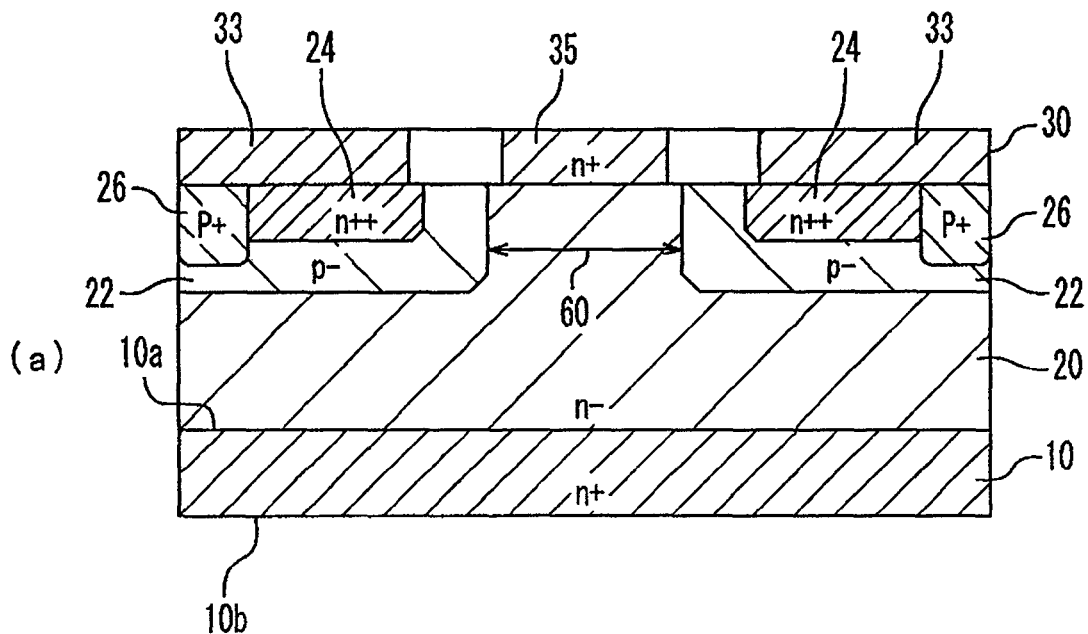
FIGS. 10(a) and 10(b) illustrate respective manufacturing process steps to fabricate the semiconductor device of the first preferred embodiment of the present invention.
Figure 10:
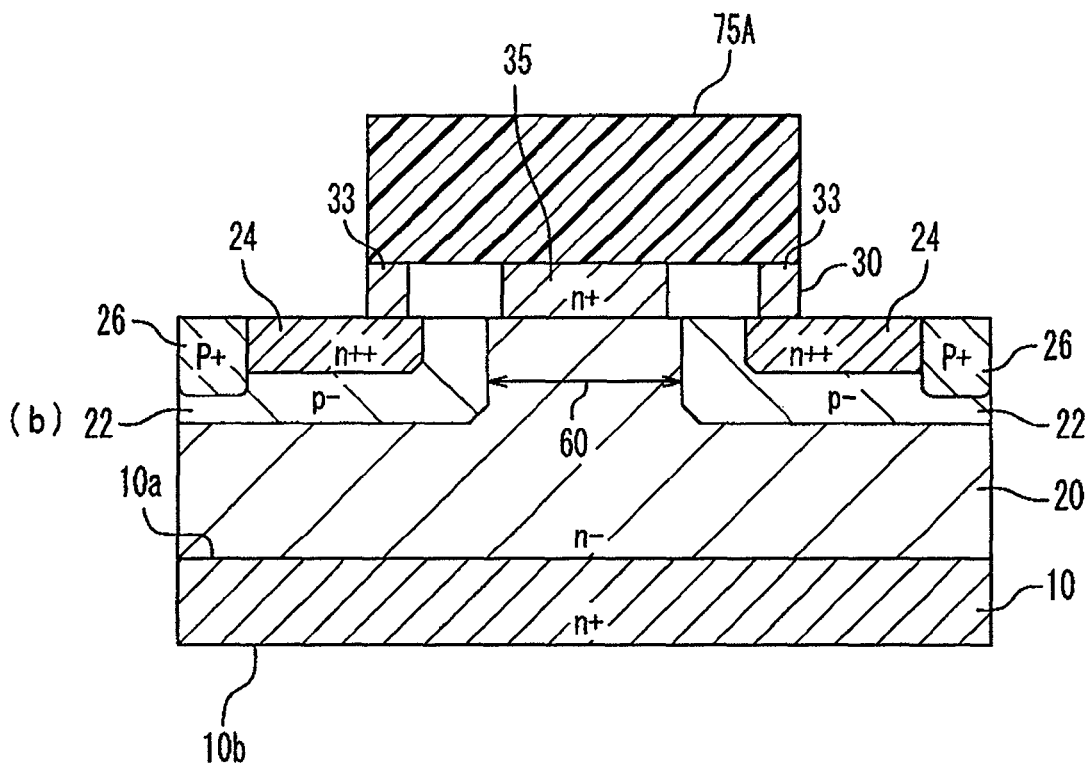
Figure 11:
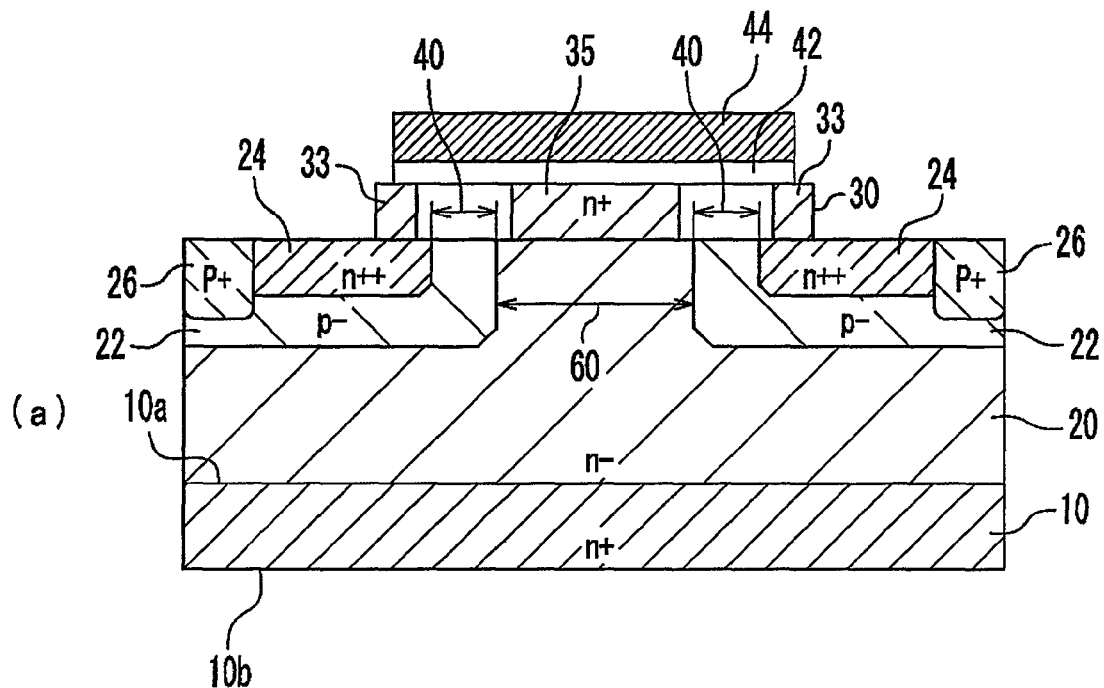
FIGS. 11(a) and 11(b) illustrate respective manufacturing process steps to fabricate the semiconductor device of the first preferred embodiment of the present invention.
Figure 11:
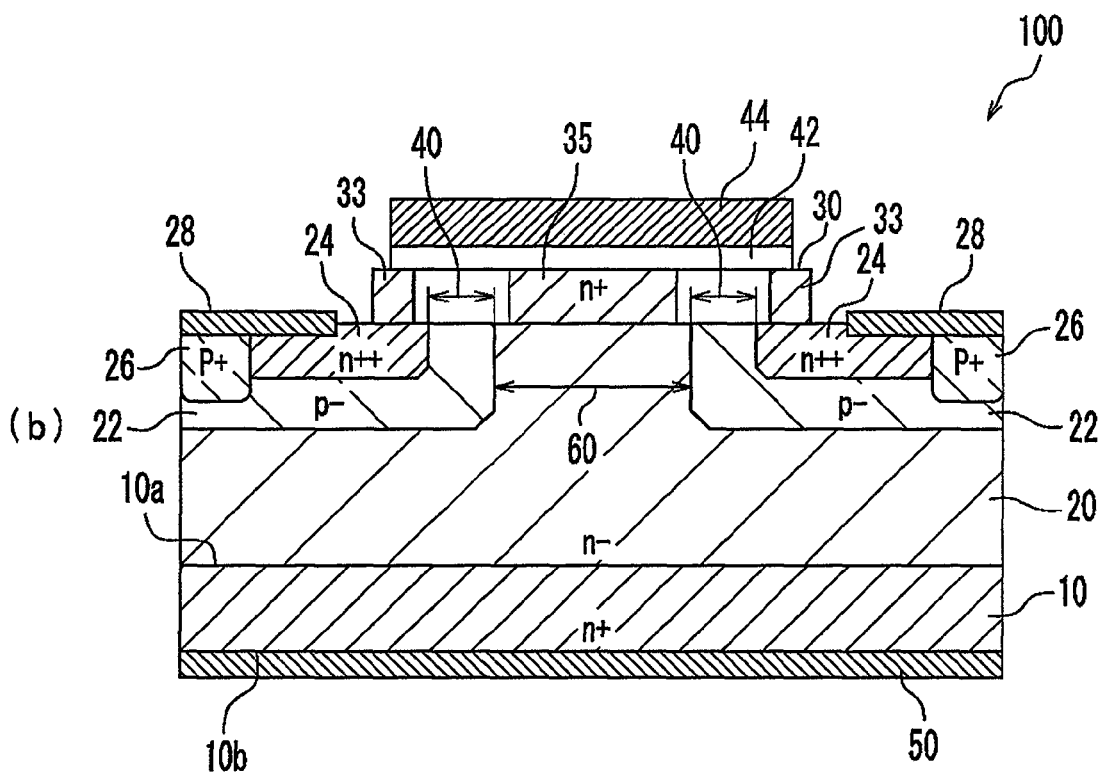

In the device 100 of this preferred embodiment, on the other hand, the portions of the channel epi-layer 30 that are located over the source regions 24 are $n^+$ portions 33 as shown in FIG. 3. That is why the overconcentration of currents in the region 98 shown in FIG. 2 can be avoided and the current can be led smoothly from the source regions 24 toward the $n^+$ portions 33 instead.

On top of that, more and more current tends to flow horizontally through the channel epi-layer 30 from the $n^+$ portions 33 toward the $n^+$ portion 35 and then from the $n^+$ portion 35 toward the JFET region 60 more smoothly (as indicated by the arrows in FIG. 3). As a result, the overconcentration of currents in the region 99 shown in FIG. 2 can be avoided.

As described above, in the device 100 of this preferred embodiment, the entire channel epi-layer 30 but the channel region 40 consists of the $n^+$ regions 33 and 35, thus minimizing the increase in ON-state resistance due to the overconcentration of currents. Even if such $n^+$ regions are arranged only as those portions 33 of the channel epi-layer 30 over the source regions 24, the overconcentration of currents can be reduced rather effectively. However, it is even more effective to provide those $n^+$ regions as both the portions 33 over the source regions 24 and the portion 35 over the JFET region 60.

Hereinafter, it will be described with reference to FIGS. 4(a) through 11(b) how to fabricate the semiconductor device of this preferred embodiment. FIGS. 4(a) through 11(b) are cross-sectional views illustrating respective manufacturing process steps of this preferred embodiment.

First of all, an n-type 4H-SiC (0001) wafer to be eventually diced into $n^+$-SiC substrates 10 is provided. In this example, however, the wafer is supposed to have already been cut into $n^+$-SiC substrates 10 that have an off-axis angle of 8 or 4 degrees with respect to the <11-20> directions and an n-type dopant concentration of $1 \times 10^{18}$ cm$^{-3}$ to $5 \times 10^{19}$ cm$^{-3}$ for convenience sake.

Next, as shown in FIG. 4(a), an $n^-$-drift epi-layer 20 is grown epitaxially on the principal surface 10a of the $n^+$-SiC substrate 10. This layer is grown so as to have a concentration of $1 \times 10^{15}$ cm$^{-3}$ to $1 \times 10^{16}$ cm$^{-3}$ and a thickness of at least 10 µm by carrying out a thermal CVD process using silane ($SiH_4$) and propane ($C_3H_8$) as source gases, hydrogen ($H_2$) as a carrier gas, and nitrogen ($N_2$) as a dopant gas, respectively.

Subsequently, as shown in FIG. 4(b), an implant masking material layer 70 is deposited on the $n^-$-drift epi-layer 20 and then a pattern of photoresist 72 is formed thereon. The implant masking material layer 70 may be made of $SiO_2$ (silicon dioxide), for example. And the implant masking material layer 70 of silicon dioxide may be formed by performing a plasma CVD process using silane ($SiH_4$) and $N_2O$ gases at a power of 200 W, for example. The implant masking material layer 70 may have a thickness of 0.5 µm to 1.0 µm, for example. The photoresist 72 has such pattern and size as to define well regions ($p^-$-layer 22) and a JFET region 60. The photoresist 72 may be a photosensitive organic film and may have its pattern defined by a typical photolithographic process. The photoresist 72 may have a thickness of 1.5 µm to 2.0 µm, for example.

Next, excessive portions of the implant masking material layer 70 are etched away using the photoresist 72 as a mask, thereby forming an implant masking pattern (well mask) 70A. After that, the photoresist 72 is removed. The implant masking material layer 70 may be etched by performing an anisotropic dry etching process using $CF_4$ and $CHF_3$ gases. And the photoresist 72 may be removed by performing an ashing process using oxygen plasma, for example.

Thereafter, as shown in FIG. 5(a), Al$^+$ ions are implanted as indicated by the arrows 80 using the implant masking pattern 70A as a mask, thereby defining well regions ($p^-$) 22 to a predetermined depth under the surface of the $n^-$-drift epi-layer 20. The ion implantation process may be carried out with the energies changed in multiple steps between 30 keV and 350 keV but with the temperature of the substrate kept at 500° C., for example. The well regions 22 may have a depth of 0.5 μm to 1.0 μm, for example. The surface region of the n⁻-drift epi-layer 20, which is defined by the well regions 22, becomes the JFET region 60. In this preferred embodiment, the JFET region 60 may have a width of 3 μm, for example.

Subsequently, as shown in FIG. 5(b), another implant masking material layer 71 is deposited over the substrate 10 (more specifically, over the well regions 22) so as to cover the implant masking pattern 70A, and then another pattern of photoresist 72A is formed thereon. The implant masking material layer 71 may be made of poly-Si (polysilicon), may be deposited by performing a thermal CVD process using $SiH_4$ as a source gas, and may have a thickness of 0.5 μm to 1.0 μm, for example. The photoresist 72A is applied to define source regions 24.

Next, using the photoresist 72A as a mask, the exposed portions of the implant masking material layer 71 are etched away anisotropically, thereby forming an implant masking pattern (source mask) 71A as shown in FIG. 6(a). Portions of the implant masking pattern 71A shown in FIG. 6(a) are located under the photoresist 72A, while other portions thereof form a sidewall that is adjacent to the implant masking pattern 70A. This etching process is preferably carried out as an anisotropic etching process using a mixture of $Cl_2$, $O_2$ and HBr gases, for example.

The width of the sidewall portions of the implant masking pattern 71A (i.e., the size as measured in the channel length direction) depends on the thickness of the implant masking material layer 71. And that thickness can be controlled highly precisely by adjusting the deposition rate and deposition process time during the process step of depositing the implant masking material layer 71.

Thereafter, as shown in FIG. 6(b), using the implant masking patterns 70A and 71A as a mask, $N^+$ (nitrogen ions) or $P^+$ (phosphorus ions) are selectively implanted as indicated by the arrows 82 into the surface region of the well regions (p⁻) 22, thereby defining source regions ($n^{++}$) 24. The ion implantation process may be carried out with the energies changed in multiple steps between 30 keV and 90 keV but with the temperature of the substrate kept at 500° C., for example. The source regions 24 may have a depth of 0.25 μm, for example.

According to the method of this preferred embodiment, the respective edges SE of the source regions 24 that are located closer to the channel region (i.e., the respective boundaries between the source regions 24 and the well regions 22) are self-aligned with their associated edges of the sidewall portions of the implant masking pattern 71A. However, if a process in which another masking pattern that has an opening to define the source regions 24 is formed by performing photolithographic and etching processes were adopted, then that another masking pattern to define the source regions should be aligned with respect to the well regions 22 (i.e., a mask alignment process should be carried out). Since such a mask alignment will always involve some degree of misalignment, the relative positions of the well regions 22 and the source regions 24 would vary from one process to another. The arrangement of the source regions 24 with respect to the well regions 22 is one of the most important parameters that determine the performance of the transistor because the arrangement defines the size (i.e., the channel length) of the channel region 40. According to this preferred embodiment, however, there is no need to perform such a mask alignment, and therefore, the arrangement of the source regions 24 with respect to the well regions 22 can be determined highly precisely. Consequently, according to this preferred embodiment, the channel length will hardly vary and the transistor can achieve originally designed performance more easily.

Next, after the implant masking patterns 70A and 71A have been removed, another implant masking material layer 72 is deposited, and then a pattern of photoresist 73A is formed thereon as shown in FIG. 7(a). The implant masking patterns 70A and 71A may be removed by wet-etching the oxide film with an HF aqueous solution and polysilicon with a mixture of HF, $HNO_3$ and $H_2O$, respectively. The implant masking material layer 72 may be made of $SiO_2$ (silicon dioxide), for example. The pattern of photoresist 73A is formed to define a $P^+$ layer 26.

Subsequently, as shown in FIG. 7(b), excessive portions of the implant masking material layer 72 are etched away using the photoresist 73A as a mask, thereby forming an implant masking pattern 72A. Thereafter, after the photoresist 73A has been removed, $Al^+$ (aluminum ions) or $B^+$ (boron ions) are implanted into the surface area of the well regions (p⁻) 22 as indicated by the arrows 84 using the implant masking pattern 72A as a mask, thereby forming a $P^+$ layer 26. The ion implantation process may be carried out with the energies changed in multiple steps between 30 keV and 150 keV but with the temperature of the substrate kept at 500° C., for example. The pn junction depth of the $P^+$ layer 26 is greater than that of the source regions ($n^{++}$) 24 and may be 0.3 μm, for example.

Next, after the implant masking pattern 72A has been removed, the substrate with the drift epi-layer 20 has its both sides covered with a carbon cap film (which will be simply referred to herein as a "C cap film") 90 as shown in FIG. 8(a). More specifically, the C cap film 90 is formed on both the upper surface of the substrate with the drift epi-layer 20, the well regions 22, the source regions 24 and the $P^+$ regions 26 and the back surface 10b of the SiC substrate 10. The C cap film 90 may be made of carbon, for example, and is separately deposited on the upper and back surfaces by performing a sputtering process. After the C cap film 90 has been deposited, the substrate 10 (more exactly, the substrate 10 with the respective layers and regions 20, 22, 24 and 26) is annealed at a temperature of at least 1,000° C. (e.g., 1,800° C., in this case) to activate the dopants introduced there. Optionally, the substrate 10 without the C cap film 90 could also be annealed within $SiH_4$ ambient gas.

Subsequently, after the C cap film 90 has been removed from both sides of the substrate, a channel epi-layer 30 is grown epitaxially thereon as shown in FIG. 8(b). Next, another implant masking material layer 74 is deposited on the channel epi-layer 30 and then a pattern of photoresist 74A is formed on the implant masking material layer 74. The C cap film 90 may be removed from both sides of the substrate by performing an ashing process using oxygen plasma, for example. The channel epi-layer 30 of this preferred embodiment is an epi i-layer of SiC and may be grown epitaxially so as to have a concentration of $1 \times 10^{15}$ cm⁻³ to $5 \times 10^{15}$ cm⁻³ and a thickness of 30 nm to 150 nm by carrying out a thermal CVD process using silane ($SiH_4$) and propane ($C_3H_8$) as source gases, hydrogen ($H_2$) as a carrier gas, and nitrogen ($N_2$) as a dopant gas, respectively. Optionally, a portion of the channel epi-layer may have its concentration increased by introducing nitrogen ($N_2$) gas during the epitaxial growth.

The implant masking material layer 74 may be made of $SiO_2$ (silicon dioxide), for example. The pattern of photoresist 74A has an opening that will define a region of the channel epi-layer 30 into which the n-type dopant will be further introduced, and is arranged so as to completely cover the surface portions of the well regions (p⁻) 22. A margin with a width of 0.1 μm to 1.0 μm is left in the regions 45 in which the photoresist pattern 74A overlaps with the source regions (n++) 24 and the JFET region 60 with expected misalignment and size variations taken into account. That is to say, the photoresist pattern 74A is arranged on the surface of the channel epitaxial layer 30 so as to be located at least over the well regions 22, the vicinity of the respective interfaces between the source regions 24 and the well regions 22, and the vicinity of the respective interfaces between the silicon carbide epitaxial layer 20 and the well regions 22.

Next, as shown in FIG. 9(a), excessive portions of the implant masking material layer 74 are etched away using the photoresist 74A as a mask, thereby forming an implant masking pattern 74B. That is to say, the implant masking pattern 74B is located on the surface of the channel epitaxial layer 30 and over the exposed surface of the well regions 22.

Subsequently, after the photoresist 74A has been removed, N+ (nitrogen ions) or P+ (phosphorus ions) are implanted into the channel epi-layer 30 as indicated by the arrows 86 using the implant masking pattern 74B as a mask, thereby defining n+ regions 33 and 35 in the channel epi-layer 30. It should be noted that the n+ dopant concentration in the channel epi-layer 30 does not have to be uniform. In this process step, the ion implantation process may be carried out with a voltage of 30 keV and at a dose of $5 \times 10^{15}$ cm$^{-3}$ to $5 \times 10^{19}$ cm$^{-3}$. Each of the first portions 33, into which the n-type dopant has been implanted in this manner, has its edge CE1 adjacent to the channel region offset so that the edge CE1 is located more distant from the second portion 35 than the boundary between its associated source region 24 and well region 22 is. On the other hand, each edge CE2 of the second portion 35 has been offset so as to be located more distant from its associated first portion 33 than the boundary of the JFET region 60 is. Due to these offsets, inside the channel epi-layer 30, a gap is left between the channel region 40 and the portions into which the n-type dopant has been implanted.

Next, after the implant masking pattern 74B has been removed, the substrate has its both sides covered with another C cap film 92 as shown in FIG. 9(b). More specifically, the C cap film 92 is formed on both the surface of the channel epi-layer 30 and the back surface 10b of the SiC substrate 10. The C cap film 92 may be made of carbon, for example, and is separately deposited on the surface of the channel epi-layer and on the back surface of the SiC substrate 10 by performing a sputtering process, for example. After the C cap film 92 has been deposited, the substrate is annealed at a temperature of at least 1,000° C. (e.g., 1,800° C. in this case) to activate the dopants introduced there. Optionally, the substrate without the C cap film 92 could also be annealed within SiH$_4$ ambient gas.

Thereafter, as shown in FIG. 10(a), the C cap film 92 is removed from both sides of the substrate and then the surface of the channel epi-layer 30 is subjected to a CMP (chemical mechanical polishing) process. If the CMP process is carried out, the surface of the channel epi-layer 30 can be planarized and the channel region 40 (see FIG. 1) can have increased carrier mobility. However, the CMP process is just an optional one and could be omitted as well.

Next, as shown in FIG. 10(b), a pattern of photoresist 75A is formed on the channel epi-layer 30 and then excessive portions of the channel epi-layer 30 are etched away using the photoresist pattern 75A as a mask. In this process step, the channel epitaxial layer 30 is partially etched away so that the source regions 24 are exposed at least partially.

Subsequently, as shown in FIG. 11(a), the photoresist 75A is removed, and then a gate oxide film (of SiO$_2$) 42 is deposited on the channel epi-layer 30. Next, a poly-Si film is deposited on the gate oxide film 42 as a material to be a gate electrode. Thereafter, a photoresist pattern (not shown) that defines the shape and location of the gate electrode 44 is formed on that poly-Si film. After the gate electrode 44 of poly-Si has been formed by patterning the poly-Si film, the photoresist is removed.

After that, a typical metallization process is carried out. Specifically, as shown in FIG. 11(b), source electrodes (made of an alloy of Ti and Si, for example) 28 and a drain electrode (also made of an alloy of Ti and Si, for example) 50 are formed, thereby completing the semiconductor device 100 of this preferred embodiment. The source electrodes 28 make electrical contact with the source regions 24 and the P+ layer 26 and may be formed by depositing Ti and then subjecting the substrate to a heat treatment process at 950° C., for example. On the other hand, the drain electrode 50 may be formed by depositing Ti on the back surface 10b of the SiC substrate 10 and then subjecting the substrate to a heat treatment process at 950° C.

As described above, the semiconductor device 100 of this preferred embodiment can reduce the overconcentration of currents while the vertical MOSFET is in ON state, thus realizing low ON-state resistance and high reliability.

Embodiment 2

Figure 12:
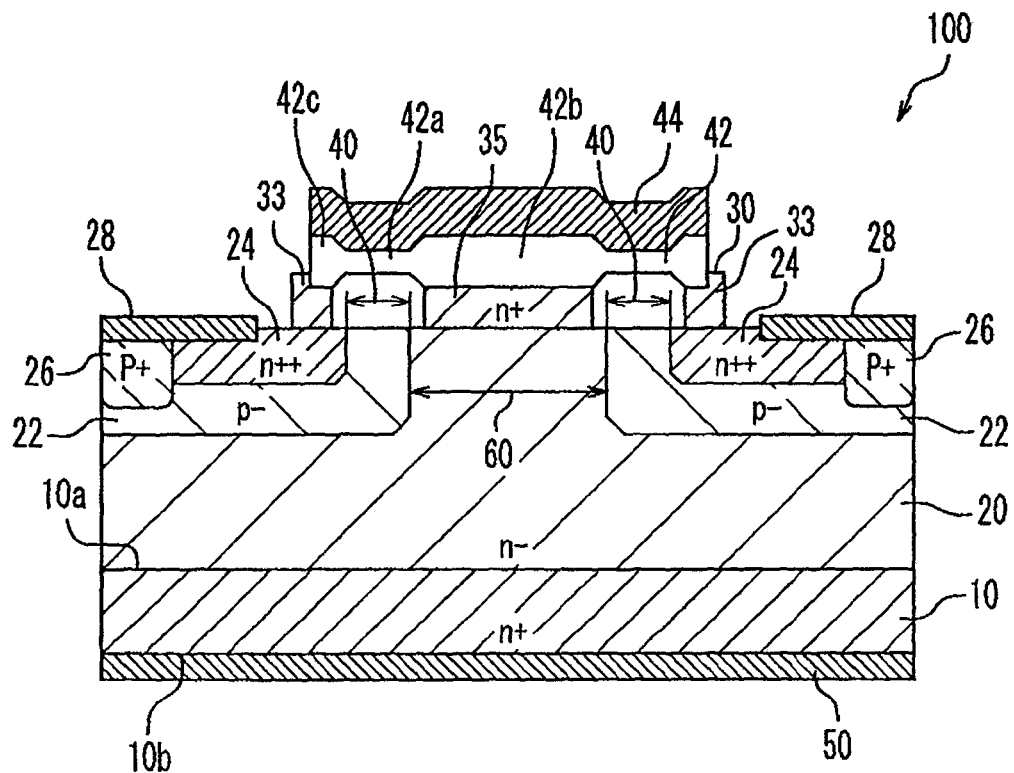
FIG. 12 is a cross-sectional view schematically illustrating the structure of a semiconductor device as a second preferred embodiment of the present invention.

FIG. 12 is a cross-sectional view schematically illustrating a second specific preferred embodiment of a semiconductor device 100 according to the present invention. Unlike the semiconductor device 100 of the first preferred embodiment shown in FIG. 1, the gate oxide film 42 on the channel epi-layer 30 has varying thicknesses in the semiconductor device 100 shown in FIG. 12. But other than that, the semiconductor device 100 of this preferred embodiment has the same configuration, and is made by the same manufacturing process, as the counterpart of the first preferred embodiment, and the description thereof will be omitted herein. Thus, the following description of the second preferred embodiment will be focused on only the configuration and effect unique to this second preferred embodiment of the present invention.

Portions of the gate oxide film 42 that are located over the n+ regions 33 and 35 of the channel epi-layer 30 are thicker than portions of the gate oxide film 42 that are located over the channel regions 40. Specifically, the portions 42c and 42b of the gate oxide film 42 located over the first and second portions 33 and 35 are thicker than the portions 42a thereof located over the channel regions 40.

In the semiconductor device 200 shown in FIG. 2, its portion over the JFET region 60 has relatively large gate capacitance, thus making it difficult for the semiconductor device 200 to operate quickly. On the other hand, in the semiconductor device 100 shown in FIG. 12, that portion 42b of the gate oxide film 42 located over the JFET region 60 has an increased thickness, and therefore, has a reduced gate capacitance. Accordingly, the semiconductor device 100 can operate more quickly. That thicker portion 42b of the gate oxide film 42 may be 1.2 to 2.0 times as thick as the portions of the gate oxide film 42 over the channel regions 40.

The structure 100 shown in FIG. 12 is realized by accelerating the oxidation of the gate oxide film. As used herein, the "accelerated oxidation of a gate oxide film" refers to a phenomenon that a portion of silicon into which a dopant (such as As) has been implanted shows a higher oxidation rate even under the same oxidation conditions. The present inventors discovered and confirmed via experiments that when an SiC substrate was oxidized at a temperature of 1,000° C. to 1,200° C., a nitrogen-implanted region showed the same oxidation rate as a non-nitrogen-implanted region but a phosphorus-implanted region showed an oxidation rate that was approximately 1.2 to 2.0 times as high as a non-phosphorus-implanted region. According to this accelerated oxidation phenomenon discovered by the present inventors, phosphorus is preferably introduced as a dopant into the n+ regions 33 and 35 in the channel epi-layer 30 and the thickness of the gate oxide film 42 can be varied locally thanks to the accelerated oxidation by that phosphorus dopant.

Embodiment 3

Figure 13:
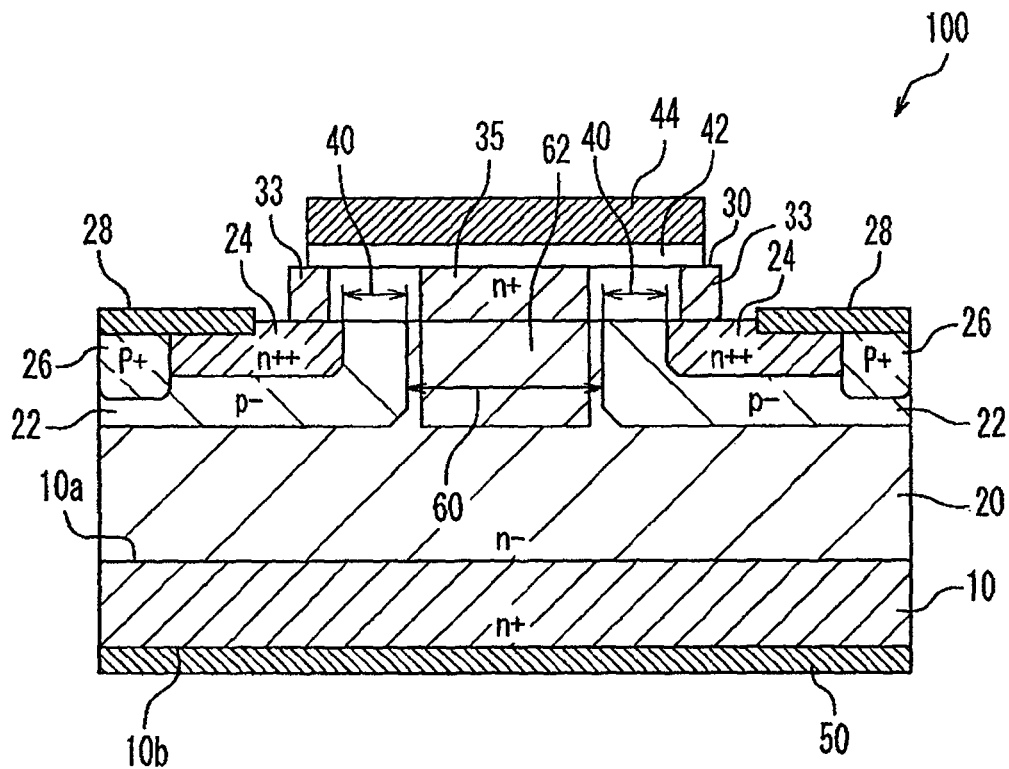
FIG. 13 is a cross-sectional view schematically illustrating the structure of a semiconductor device as a third preferred embodiment of the present invention.

FIG. 13 is a cross-sectional view schematically illustrating a third specific preferred embodiment of a semiconductor device 100 according to the present invention. Unlike the semiconductor device 100 shown in FIG. 1, the JFET region 60 has a region 62 into which a dopant of a first conductivity type (n-type in this example) has been implanted in the semiconductor device 100 shown in FIG. 13. But other than that, the semiconductor device 100 of this preferred embodiment has the same configuration, and is made by the same manufacturing process, as the counterpart of the first preferred embodiment, and the description thereof will be omitted herein. Thus, the following description of the third preferred embodiment will be focused on only the configuration and effect unique to this third preferred embodiment of the present invention.

In the example illustrated in FIG. 13, the concentration of the n-type dopant implanted into the JFET region 60 (i.e., the concentration of the dopant in the region 62) is defined to be lower than (and preferably much lower than) that of the dopant of the second conductivity type (i.e., p-type in this example) included in the well regions 22. Also, that region 62 (i.e., n⁻-doped layer 62) is located right under the n+ region 35 of the channel epi-layer 30. That region 62 of this preferred embodiment can be defined by implanting the n-type dopant with an energy of 30 keV to 700 keV and at a dose of $1 \times 10^{16}$ cm⁻³ to $1 \times 10^{17}$ cm⁻³.

In the semiconductor device 100 shown in FIG. 13, the dopant concentration in the JFET region 60 (more specifically, the dopant concentration in the region 62) is defined to be higher than the n-type dopant concentration in the drift epi-layer 20, thereby reducing the ON-state resistance of the semiconductor device 100 shown in FIG. 1. Also, supposing the JFET resistance is the same, the semiconductor device 100 shown in FIG. 13 can have a narrowed JFET gap, and therefore, a decreased chip area. Optionally, the feature of the structure shown in FIG. 12 may be introduced into the semiconductor device 100 shown in FIG. 13.

Figure 14:
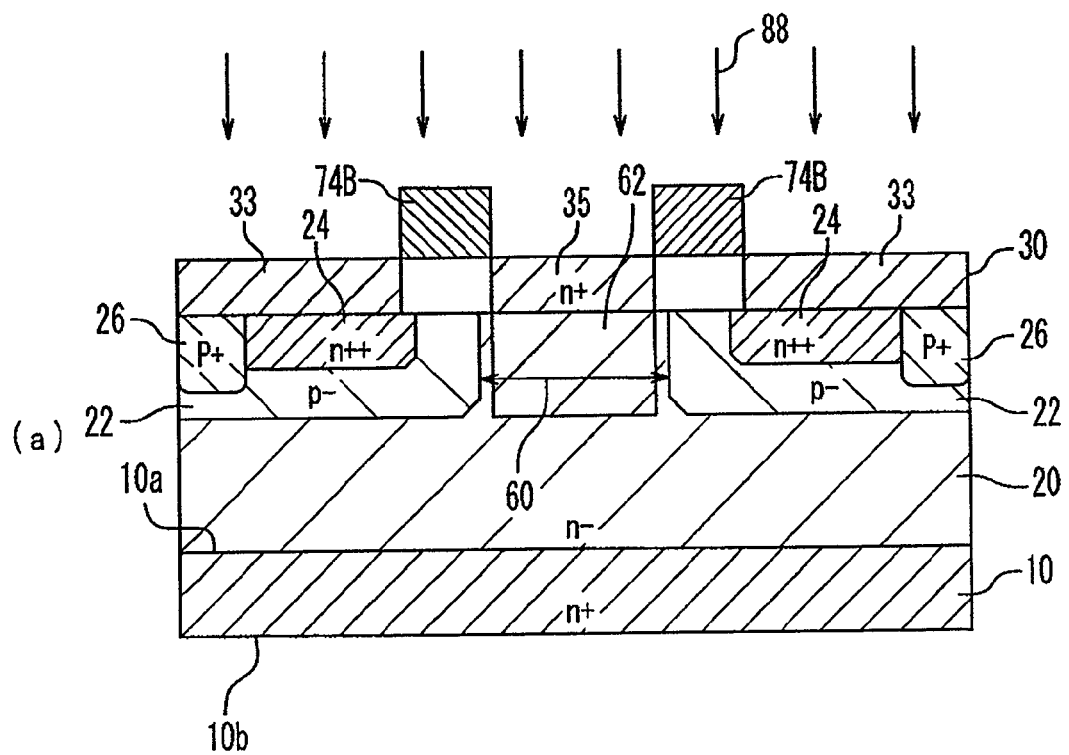
FIGS. 14(a) and 14(b) are cross-sectional views illustrating respective manufacturing process steps to fabricate the semiconductor device of the third preferred embodiment of the present invention.
Figure 14:
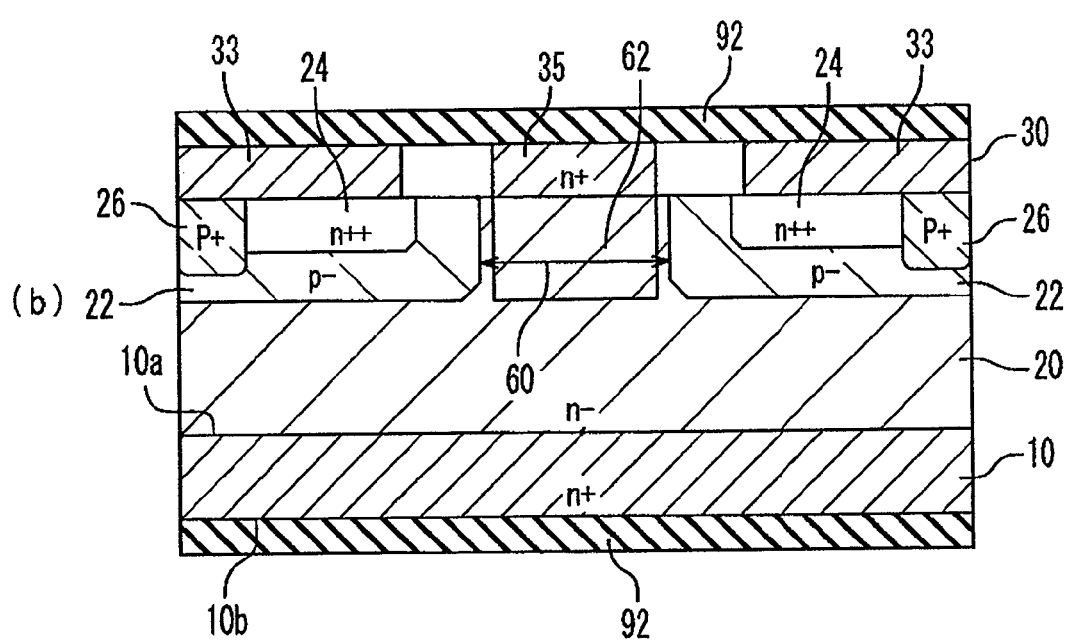
Figure 15:
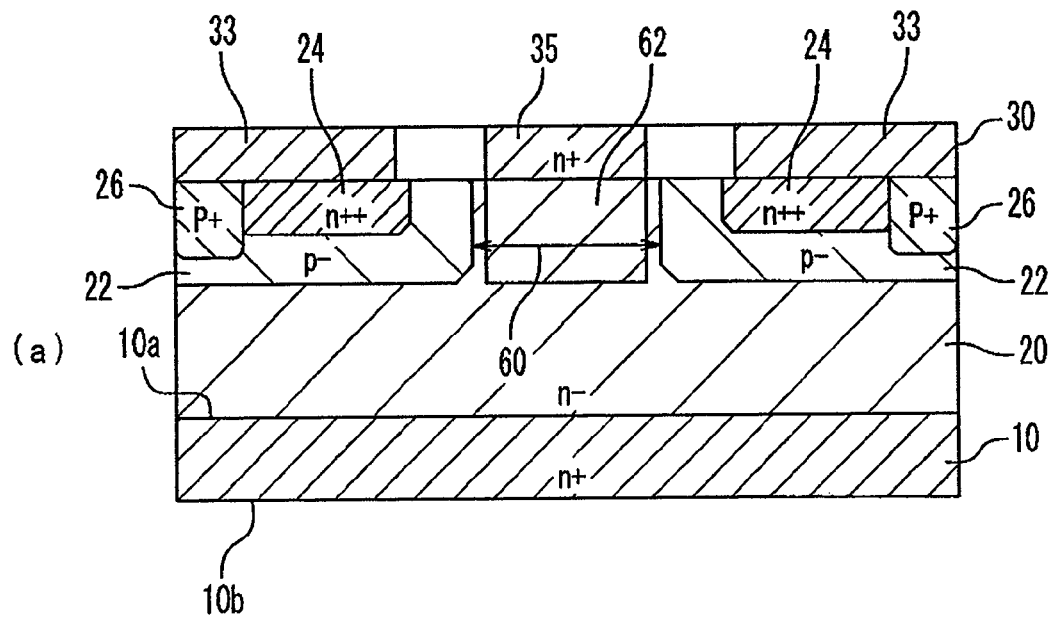
FIGS. 15(a) and 15(b) are cross-sectional views illustrating respective manufacturing process steps to fabricate the semiconductor device of the third preferred embodiment of the present invention.
Figure 15:
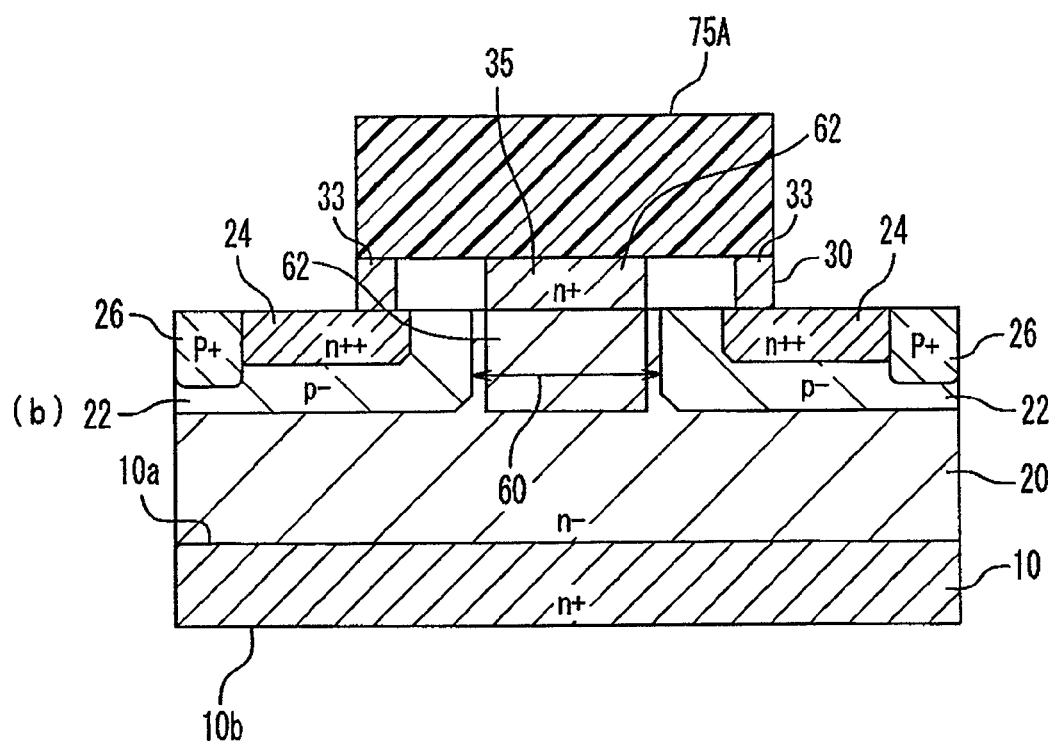
Figure 16:
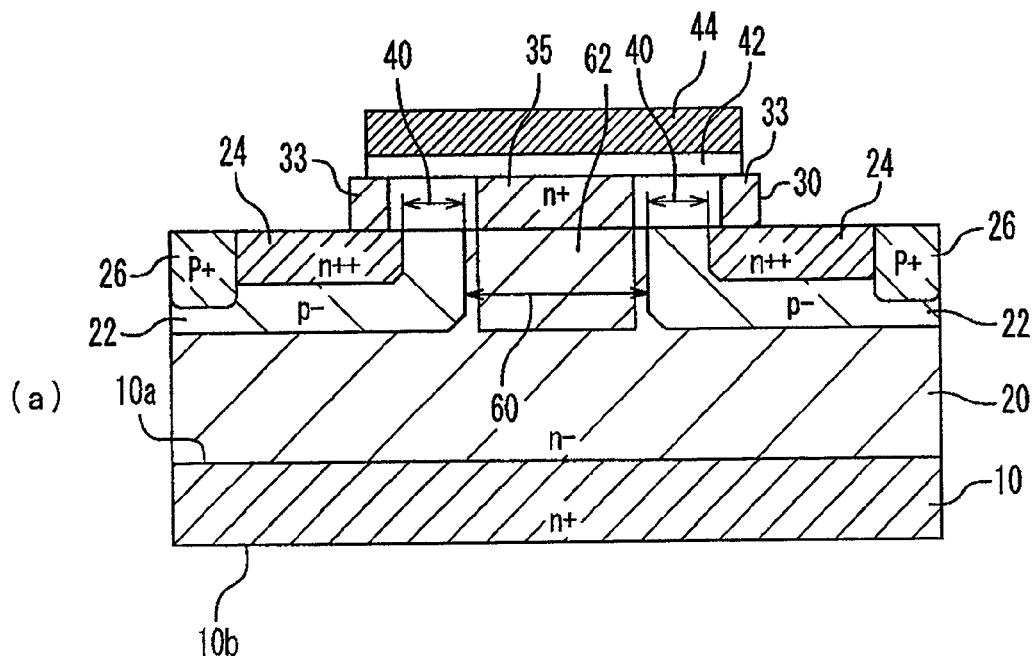
FIGS. 16(a) and 16(b) are cross-sectional views illustrating respective manufacturing process steps to fabricate the semiconductor device of the third preferred embodiment of the present invention.
Figure 16:
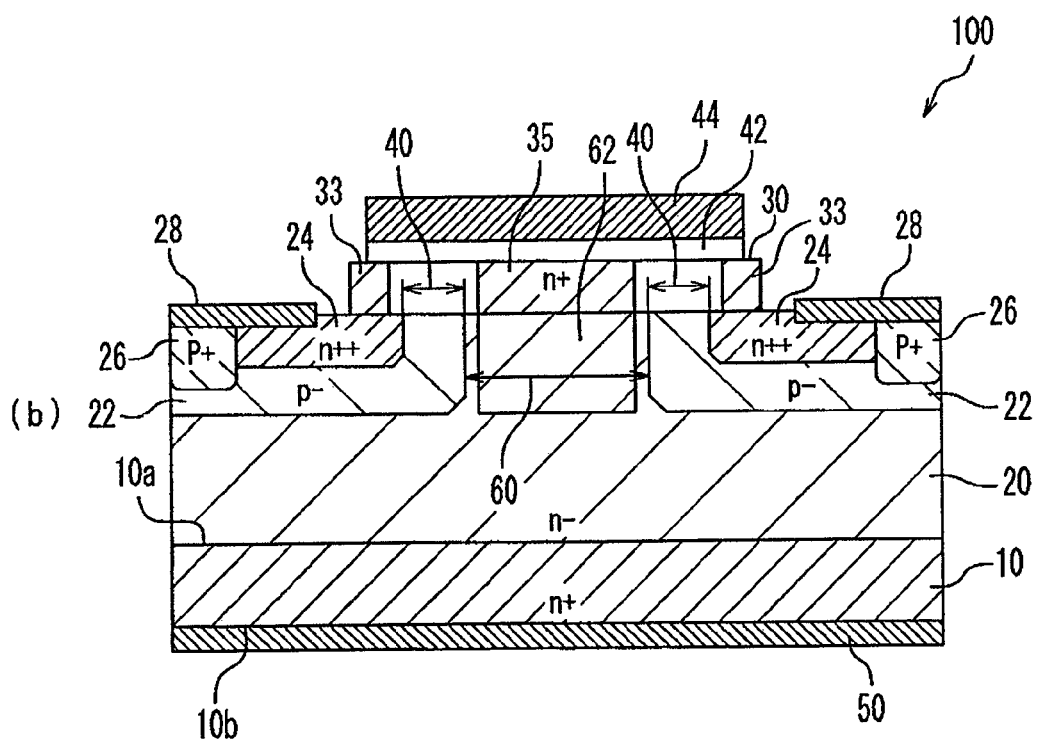
Figure 17:
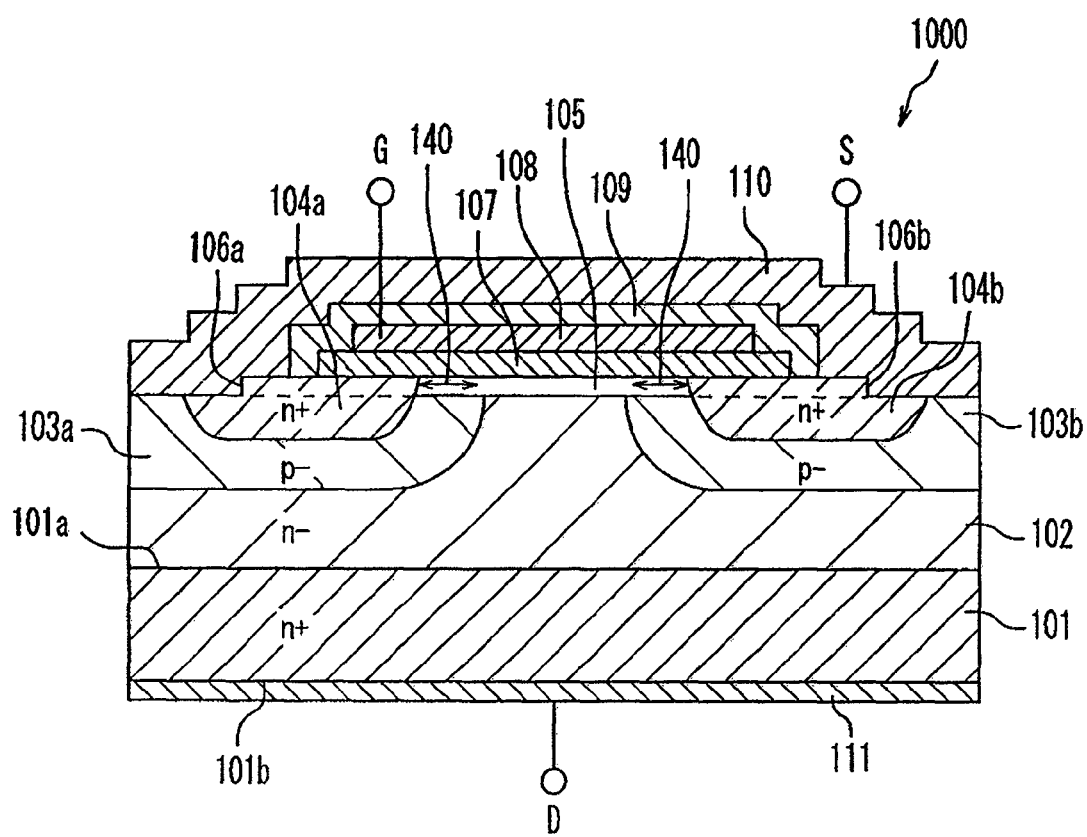
FIG. 17 is a cross-sectional view schematically illustrating the structure of a conventional silicon carbide semiconductor device.

The semiconductor device 100 shown in FIG. 13 may be fabricated as shown in FIGS. 14 to 16, for example.

First of all, as shown in FIG. 9(a), n+ regions 33 and 35 are defined in the channel epi-layer 30. Next, as shown in FIG. 14(a), N+ (nitrogen ions) or (phosphorus ions) are implanted into the JFET region 60 as indicated by the arrows 88 using the implant masking pattern 74B as a mask, thereby defining a region 62 (as an n⁻-doped layer 62). In this case, the dopant concentration (i.e., the n-type dopant concentration) in the region 62 is defined to be lower than the dopant concentration (i.e., the p-type dopant concentration) in the well regions 22. Then, even if the implant masking pattern 74B were misaligned to implant the n-type dopant into the end portions of the well regions 22 accidentally, the conductivity type of the well regions 22 would not invert but remain p-type.

Thereafter, similar process steps to the ones shown in FIGS. 9(b) through 11(b) are carried out. Specifically, a C cap film 92 is formed on both the surface of the channel epi-layer 30 and the back surface 10b of the SiC substrate 10 as shown in FIG. 14(b). The C cap film 92 may be made of carbon, for example, and is separately deposited on the surface of the channel epi-layer 30 and on the back surface 10b of the SiC substrate 10 by performing a sputtering process, for example. After the C cap film 92 has been deposited, the substrate is annealed at a temperature of at least 1,000° C. (e.g., 1,800° C. in this case) to activate the dopants introduced there. Optionally, the substrate without the C cap film 92 could also be annealed within SiH₄ ambient gas.

Next, as shown in FIG. 15(a), the C cap film 92 is removed from both sides of the substrate. Next, as shown in FIG. 15(b), a pattern of photoresist 75A is formed on the channel epi-layer 30 and then the channel epi-layer 30 is etched using the photoresist pattern 75A as a mask.

Subsequently, as shown in FIG. 16(a), the photoresist 75A is removed, and then a gate oxide film (of SiO₂) 42 is deposited on the channel epi-layer 30. Next, a gate electrode (of poly-Si) 44 is formed on the gate oxide film 42. Thereafter, a photoresist pattern (not shown) is formed on the gate electrode 44 to etch it, and then the photoresist is removed. After that, a typical metallization process is carried out to complete a semiconductor device 100 with the structure shown in FIG. 13 as shown in FIG. 16(b).

Although the present invention has been described by way of preferred embodiments, those embodiments are just an example. And they can be readily modified in various manners unless those modifications depart from the true scope and spirit of the present invention. That is to say, the present invention also embraces those modified embodiments. For example, the present invention can also be carried out with the conductivity types used in the foregoing description of preferred embodiments all inverted.

INDUSTRIAL APPLICABILITY

A semiconductor device according to the present invention can minimize the increase in ON-state resistance, and eventually deterioration of the overall performance, due to over-concentration of currents, and can be used effectively as a silicon carbide power semiconductor device with a breakdown voltage that is high enough to draw large currents.

The invention claimed is:
1. A semiconductor device comprising:
a semiconductor substrate of silicon carbide of a first conductivity type, which has a principal surface and a back surface that is opposite to the principal surface;
a silicon carbide epitaxial layer of the first conductivity type, which has been grown on the principal surface of the semiconductor substrate and which has a lower dopant concentration than the semiconductor substrate;
well regions of a second conductivity type, which form parts of the silicon carbide epitaxial layer;
source regions of the first conductivity type, which form respective parts of the well regions; and
a channel epitaxial layer of silicon carbide of the first conductivity type, which has been grown on the silicon carbide epitaxial layer,
wherein the channel epitaxial layer includes:
a first portion, which is located over the source regions;
a second portion, which is located over another part of the silicon carbide epitaxial layer where the well regions are not defined; and
a channel region, which is located over the well regions and which is interposed between the first and second portions, and wherein the dopant concentration of the first and second portions is lower than that of the source regions but higher than that of the channel region.

2. The semiconductor device of claim 1, wherein in the channel epitaxial layer, the first and second portions thereof have the same dopant concentration.

3. The semiconductor device of claim 1, wherein an edge of the first portion that is adjacent to the channel region has been offset so as to be located more distant from the second portion than the boundary between the source and well regions is, and wherein an edge of the second portion has been offset so as to be located more distant from the first portion than the boundary between the silicon carbide epitaxial layer of the first conductivity type and the well regions is.

4. The semiconductor device of claim 1, further comprising:

a gate oxide film, which has been formed on the channel epitaxial layer;

a gate electrode, which has been formed on the gate oxide film;

source electrodes, which have been formed on the source regions; and a drain electrode, which has been formed on the back surface of the semiconductor substrate.

5. The semiconductor device of claim 3, wherein the gate oxide film is thicker over the first and second portions of the channel epitaxial layer than over the channel region.

6. The semiconductor device of claim 1, wherein a part of the silicon carbide epitaxial layer that is interposed between the well regions functions as a JFET region.

7. The semiconductor device of claim 6, wherein a dopant of the first conductivity type has been implanted into the JFET region.

8. The semiconductor device of claim 7, wherein the concentration of the dopant of the first conductivity type that has been implanted into the JFET region is lower than that of the dopant of the second conductivity type in the well regions.

* * * * *